United States Patent [19]
Bronner et al.

[11] Patent Number: 6,037,194
[45] Date of Patent: Mar. 14, 2000

[54] METHOD FOR MAKING A DRAM CELL WITH GROOVED TRANSFER DEVICE

[75] Inventors: Gary B. Bronner, Stormville, N.Y.; Toshiharu Furukawa, Essex Junction, Vt.; Mark C. Hakey; Steven J. Holmes, both of Milton, Vt.; David V. Horak, Essex Junction, Vt.; Jack A. Mandelman, Stormville, N.Y.; Paul A. Rabidoux, Winooski, Vt.

[73] Assignee: International Business Machines Coirporation, Armonk, N.Y.

[21] Appl. No.: 09/281,136

[22] Filed: Mar. 29, 1999

Related U.S. Application Data

[62] Division of application No. 09/056,903, Apr. 7, 1998.

[51] Int. Cl.$^7$ .................................................. H01L 21/339
[52] U.S. Cl. ............................................ 438/147; 438/175
[58] Field of Search ................................. 438/244, 243, 438/142, 175, 147

[56] References Cited

U.S. PATENT DOCUMENTS

| | | |
|---|---|---|
| 4,003,126 | 1/1977 | Holmes et al. . |
| 4,048,649 | 9/1977 | Bohn . |
| 4,191,963 | 3/1980 | Schmidt et al. . |
| 4,243,997 | 1/1981 | Natori et al. . |
| 4,296,429 | 10/1981 | Schroeder . |
| 4,453,305 | 6/1984 | Janes et al. . |
| 4,455,740 | 6/1984 | Iwai . |
| 4,499,651 | 2/1985 | Kohn . |
| 4,571,815 | 2/1986 | Baliga et al. . |
| 5,408,116 | 4/1995 | Tanaka et al. . |
| 5,583,065 | 12/1996 | Miwa . |
| 5,614,431 | 3/1997 | DeBrosse . |
| 5,623,152 | 4/1997 | Majumdar et al. . |
| 5,640,034 | 6/1997 | Malhi . |
| 5,726,463 | 3/1998 | Brown et al. . |

FOREIGN PATENT DOCUMENTS 2 526 586   5/1982   France .

*Primary Examiner*—Chandra Chaudhari
*Assistant Examiner*—Craig Thompson
*Attorney, Agent, or Firm*—Scully, Scott, Murphy & Presser; Eugene I. Shkurko, Esq

[57] ABSTRACT

A memory cell having a grooved gate formed in a sublithographic groove, and methods of making thereof are disclosed. The groove extends the channel length to include the groove sidewalls and width of the groove. Sidewall sections of the channel located along the gate sidewalls have a larger length than the bottom channel section length located along the gate bottom width. Thus, the memory device is primarily controlled by the sidewall channel sections, instead of the bottom channel section. The groove may be a stepped groove formed by a two step etch to further increase the channel length and may be formed centered along the gate conductor width.

35 Claims, 18 Drawing Sheets

METHOD FOR MAKING A DRAM CELL WITH GROOVED TRANSFER DEVICE

RELATED APPLICATION

This application is a divisional application of U.S. Ser. No. 09/056,903, filed Apr. 7, 1998.

BACKGROUND OF THE INVENTION

1. Field of the Invention

The present invention is directed to a semiconductor memory cell having a grooved planar transfer device, and methods for making thereof, and more particularly, to a DRAM (dynamic random access memory) cell having an increased channel length resulting from the groove.

2. Discussion of the Prior Art

There is much interest to scale down densely packed semiconductor devices on an integrated circuit (IC) chip to reduce the size and power consumption of the chip, and allow faster operation. In order to achieve the high packing density necessary for Gbit memory applications, such as 1 Gbit and beyond, it is crucial to shrink the size of an individual memory cell as much as possible.

FIG. 1 shows a schematic of a typical DRAM cell 100 having a field effect transistor (FET) 105 and a storage capacitor $C_s$. The gate of the FET 105 acts as the wordline W/L. A bitline B/L is connected to one terminal of the FET 105, which terminal is the source or drain of the DRAM, depending on the application, such as read and write operations. The other DRAM terminal is connected to a strap or storage node 110 of the storage capacitor $C_s$. The other terminal of the storage capacitor $C_s$ is referred to as a plate 115. When the FET 105 is turned on by an appropriate signal on the wordline W/L, data is transferred between the bitline B/L and the storage node 110.

In conventional designs that use planar transistors, the cell size is minimized by scaling lithographic features F. F is the minimum linewidth of the feature size that can be patterned with lithography. Accordingly, if a minimum cell size is to be obtained, it is necessary to reduce the size of the transistor 105 of FIG. 1 as much as possible. This reduces the gate channel length. However, shorter gate channel lengths increase leakage currents between the storage node 110 and bitline B/L to unacceptable levels. The reduced gate channel lengths degrade subthreshold leakage, and hence the retention time. Subthreshold leakage may be reduced by increasing the channel doping concentration. However, this increases and degrades junction leakage, which also reduces retention time.

In light of the foregoing, there is a need for a high density memory cell having a proper gate channel length, without increasing the lateral area of the cell or without increasing the doping concentration in the channel of the FET array.

SUMMARY OF THE INVENTION

The object of the present invention is to provide a memory cell array, and a method of making thereof, that eliminate the problems of conventional memory cell arrays.

Another object of the present invention is to provide a memory cell having an increased channel length without increasing the cell area.

A further object of the present invention is to provide a memory cell array, and a method of making thereof, where the memory cell has source and drain regions that are self-aligned to the gate without increasing the cell area.

Yet another object of the present invention is to provide a memory cell array, and a method of making thereof, where the memory cell has a groove which may or may not be self-aligned under the word line.

An additional object of the present invention is to provide a memory cell having a high density without detrimentally increasing leakage current and decreasing retention time.

These and other objects of the inventions are achieved by a semiconductor device and a method of making thereof, which includes a memory cell having a grooved gate formed in a sub-lithographic groove. The groove extends the channel length to include the groove sidewalls and width of the groove. Each sidewall section, or the sum of the two sidewall sections, of the channel located along the gate sidewalls has a larger length than the length of the bottom channel section located along the gate bottom. Thus, the memory device is primarily controlled by the sidewall channel sections, instead of the bottom channel section.

The groove is etched into the substrate through an opening formed by patterning a resist using lithographic or sub-lithographic methods. In one embodiment, the opening width is further reduced by forming spacers on the opening's sidewalls. The groove may be self-aligned, i.e., centered along the width of the gate conductor.

In another embodiment, the gate extends over the substrate beyond the groove width, and the source and drain regions are self-aligned to the gate. The source and drain regions are implanted prior or after forming the groove. In yet another embodiment, the groove is a stepped groove formed by a two step etch to further increase the channel length.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 1:
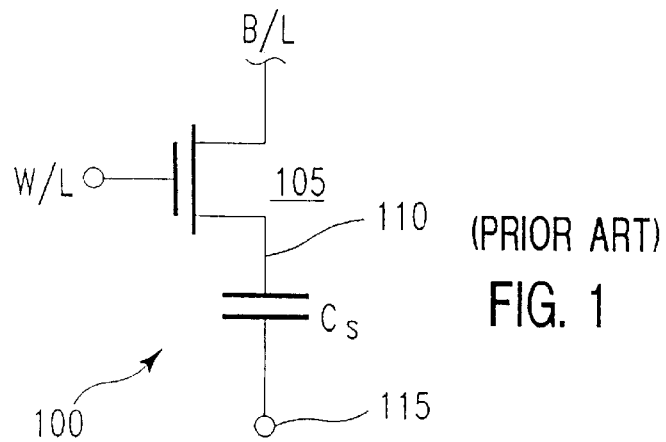
FIG. 1 shows a schematic of a conventional DRAM cell.
Figure 2:
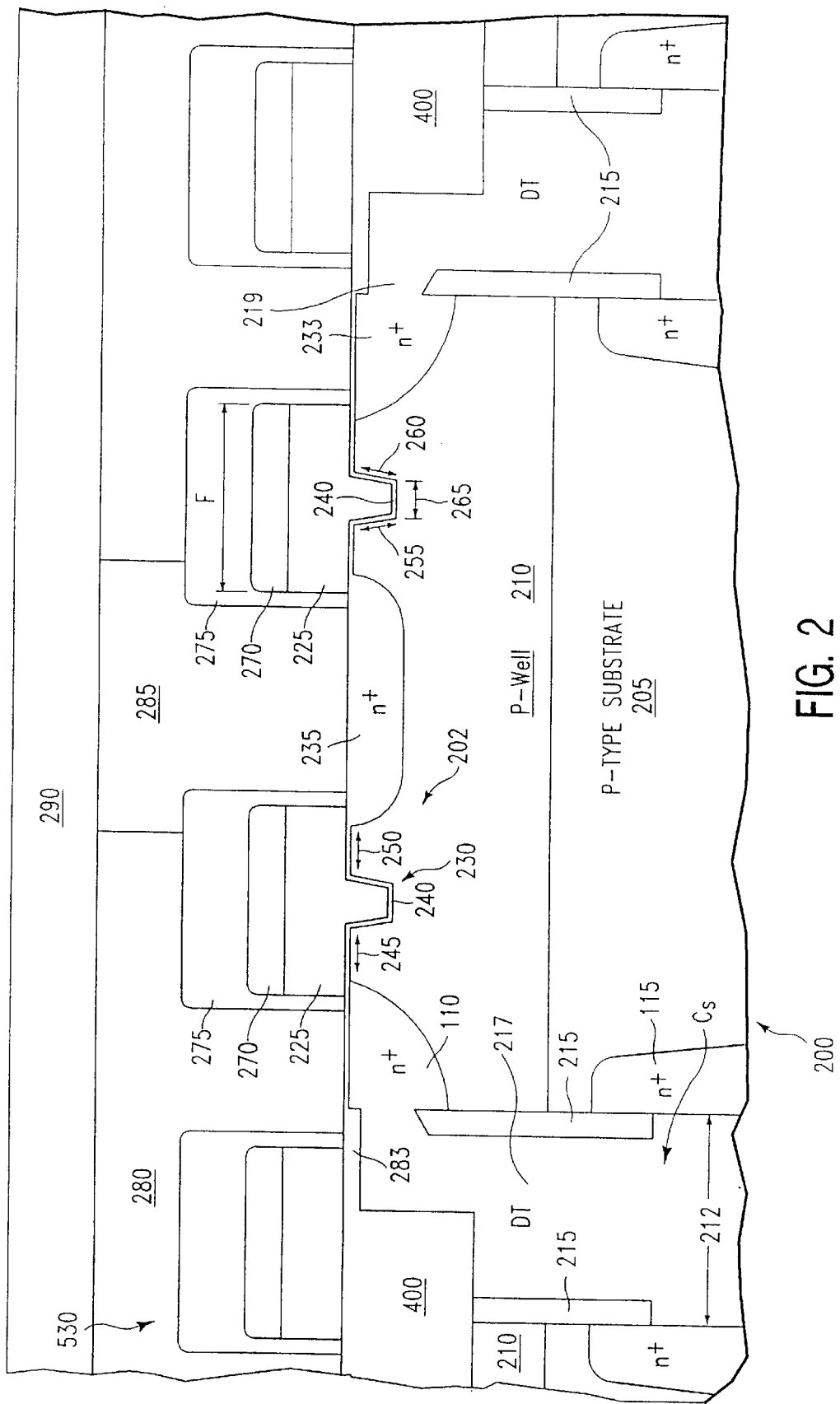
FIG. 2 shows a cross section of a memory cell according to the present invention.

FIG. 2 shows a cross section of a memory cell 200 according to one embodiment of the present invention. The memory cell includes a semiconductor device, such as a field effect transistor (FET), formed in a substrate 205 doped with P-type material, for example, having a P-well 210 formed therein. The capacitor plate 115, also shown in FIG. 1, is formed in the substrate 205 by forming an N+ region 115 in the substrate 205.

A deep trench (DT) is etched into the substrate 205 and the storage capacitor plate 115 is formed by outdiffusing N+ dopant from the DT sidewalls. Node dielectric 212 is formed and the deep trench (DT) is filled with doped polysilicon. The polysilicon is recessed, and an insulating collar 215 is formed on the top sidewall portions of the deep trench DT, which is then filled with doped polysilicon 217. Note, the insulating collar 215 is excluded from an upper part 219 of one of the top DT sidewall portions in order to out-diffuse a strap 110 from the DT polysilicon 217.

The DT polysilicon 217 is recessed again to expose parts of the collar 215, which is silicon oxide for example. The exposed collar is etched and the recess is filled again with polysilicon 217, from which the strap 110 is out-diffused to connect the DT polysilicon 217 to the source/drain of the transfer device 202. As described in connection with FIG. 1, the storage node 110 of the capacitor is the source or drain region of a FET 202 formed in the P-well 210. As shown in FIG. 2, a shallow trench isolation regions STI 400 covers a portion of the deep trench DT.

The FET 202 has a grooved gate 225 formed in a groove 230, which is formed in the P-well 210 between the source and drain N+ regions 110, 235 of the FET 202. The grooved gate 225 extends beyond the groove 230 over the substrate, and the source or drain regions 110, 235 are self-aligned to the gate 225, for example. Illustratively, the source or drain regions 110, 235 are heavily doped N+ regions in the P-well 210.

The groove 230 may be self aligned to be at the center of the gate 225, for example. Alternatively, the groove 225 is not self-aligned, and may be anywhere below gate 225. A thin layer of gate oxide 240 separates the gate 225 from the FET channel in the P-well 210. The groove 230 extends the width of the FET channel as described below and shown as reference numeral 325 in FIG. 3. The groove 230 also extends the length of the FET channel to include sidewalls and bottom width of the groove 230, which channel length is shown as reference numerals 255, 265, 260 in FIG. 2. In addition, to further extend the channel length, the groove 230 is separated from the source/drain N+ regions 110, 235 so that the channel length is increased to include lateral distances 245, 250, shown in FIG. 2.

The gate 225 is formed of polysilicon, which may be doped with either N+ or P+ impurities, and acts as the wordline W/L (also shown in FIG. 1) of the memory cell 200. In this embodiment, portions of the gate 225 extend over the P-well 210. This extends the gate 225 beyond the groove 230 to control the resistance of the FET channel, which is located in the P-well 210 between the source/drain N+ regions 110, 235. The groove 230 and grooved gate 225 extend the length of the channel to include the distances 245, 250 between the groove 230 and the source/drain N+ regions 110, 235, the distances 255, 260 of the groove sidewalls, and the bottom width 265 of the groove 230.

Figure 3:
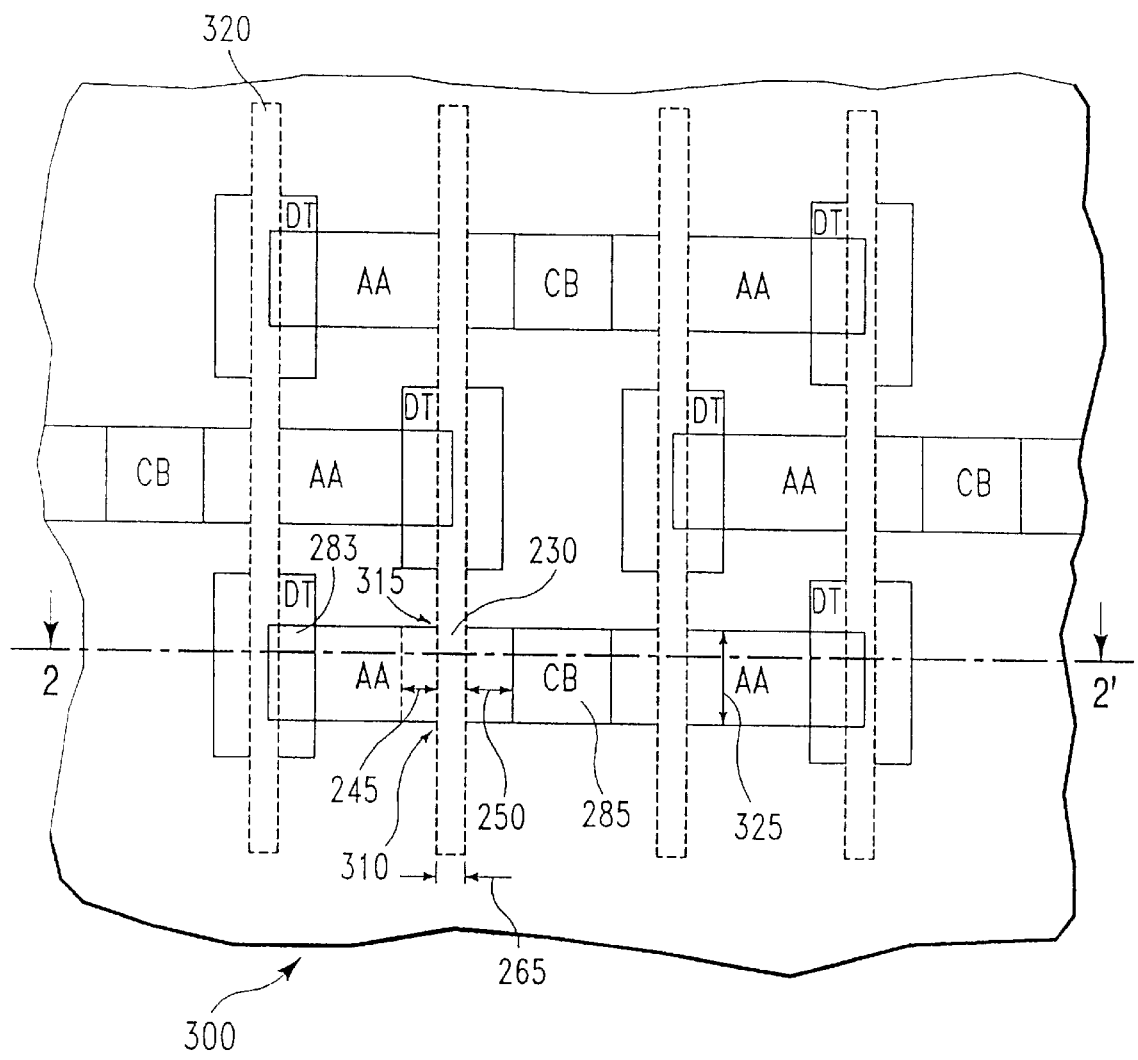
FIG. 3 is top view of a layout of an array of several of the memory cells shown in FIG. 2 according to the present invention.

The lateral distances 245, 250 between the groove 230 and the source/drain N+ regions 110, 235, and the width 265 of the groove 230 are also shown in FIG. 3. FIG. 3 is top view of a layout of an array 300 of several of the memory cells 200, where FIG. 2 is a cross section of the layout shown in FIG. 3 along the line 2–2'.

FIG. 3 also shows exposed strips 320 used to form the grooves 230, which are only formed in the active regions AA by selective etching the silicon substrate to the surrounding insulating layer. The width of the gate formed in the groove 230 is shown in FIG. 3 as reference numeral 325.

Illustratively, the grooves 230 are formed by patterning a mask 330 (shown in FIG. 4) to cover areas other than the exposed strips 320. The shallow trench isolation regions STI shown in FIG. 2, surround the active regions AA, shown in FIG. 3. As shown in FIGS. 2 and 3, an insulating layer 283 covers the portion of the active regions AA that overlaps the deep trench DT. FIG. 3 also shows the deep trenches DT as well as the bit line contacts CB, which are also shown in FIG. 2 as reference numeral 285.

Returning to FIG. 2, a shallow trench isolation region (STI) 400 is formed in the substrate, e.g., over portions of the deep trench DT, to isolated the FET 202 from other devices formed in the substrate. Illustratively, the STI regions 400, the top covers 283 of the deep trenches DTs, and the collars 215 are oxides of silicon.

As shown in FIG. 2, the depth of the STI regions 400 is greater than a depth of the groove 230. This fully isolates the memory cell 200 from other adjacent devices, such as other memory cells that form an array of memory cells, as shown by reference numeral 300 in FIG. 3. Having STI regions 400 that are deeper than the groove 230 reduces leakage of charges stored in the deep trench capacitor $C_s$ when the FET 202 is in the OFF state. Otherwise, large leakage occurs which detrimentally degrades the performance of the memory cell 200 and prevents its use as a DRAM cell.

If the depth of isolation region STI is less than a depth of the groove 230, then leakage is particularly pronounced at the ends 310, 315 of the groove 230, shown in FIG. 3. Thus, having isolation regions STI that are deeper then the groove depth, minimizes leakage, including leakage at the groove ends 310, 315.

As shown in FIG. 2, a gate contact or wiring layer 270, also referred to as a gate conductor, such as a tungsten W or a tungsten suicide $WSi_x$ layer for example, is formed over the gate 225. The gate 225 and gate wiring 270 have a width that equals a minimum lithographic feature size F. Accordingly, the width of the groove 230 located below a portion of the gate 225 is less than the feature size F.

An insulator or dielectric 275, such as a nitride, is formed to cover the gate wiring 270 and sidewalls of the gate 225. An oxide layer 280 is formed over the memory cell 200 and is etched selectively to the insulator 275 to form a bit line contact opening that exposes the source and drain N+ region 235 located furthest from the deep trench DT. The opening over the exposed N+ region 235 is filled with a conductive material to form the bit line contact 285 borderlessly to the word-line or gate 225. Finally, a bit-line 290 is formed over the oxide layer 280 to connect various bit line contacts 285 arranged in rows of the array 300, shown in FIG. 3, formed from many of the memory cells 200 arranged in rows and columns.

Referring to FIGS. 2 and 3, the source and drain regions 110, 235 are located along the length 325 of groove 230 and the channel is located in the P-well 210 along the lateral, sidewalls and bottom portions of the gate 225. The length of the channel is the sum of the lateral distances 245, 250 between the source/drain regions 110, 235, the distances 255, 260 of the sidewalls of the groove 230, equaling approximately twice the depth of the groove 230, and the width 265 of the groove 230. In other embodiments to be described, the gate 225 may be confined within the groove 230, and the source/drain regions 110, 235 abut the groove 230. In this case, the length of the channel is approximately the distances 255, 260 of the groove sidewalls plus the groove bottom width 265.

As shown in FIG. 3, the width of the channel is approximately the length 325 of the groove 230. Accordingly, as shown in FIG. 2, the channel sidewall sections located along the gate sidewall portions 255, 260, each or together, have a larger length than the length of the bottom channel section located along the gate bottom portion 265. If desired, the groove 230 may be deeper so that each sidewall length 255 or 260 is greater than the bottom width 265. Having larger sidewalls sections than a bottom section allows the gate sidewall portions 255, 260 (FIG. 2) to predominantly control the memory cell 200.

By contrast, conventional grooved devices have the predominant portion of the channel at the bottom of a grooved gate, as opposed to the sidewalls of the groove, and are controlled by the bottom portion of the grooved gate or channel, instead of the sidewalls portions thereof Controlling the FET or memory cell by the grooved gate's sidewalls provides substantial benefits, such as increased channel length, inproved shielding from penetration of drain electric field to the source, referred to as drain induced barrier lowering (DIBL), and a threshold voltage which is independent of the dimension of the groove, particularly the width of the groove. By using the sidewalls of the groove to control the threshold voltage $V_1$ of the MOSFET array, the doping in the channel may be reduced, thus avoiding degradation, i.e., increase, ofjunction leakage due to high doping effects.

Figure 4:
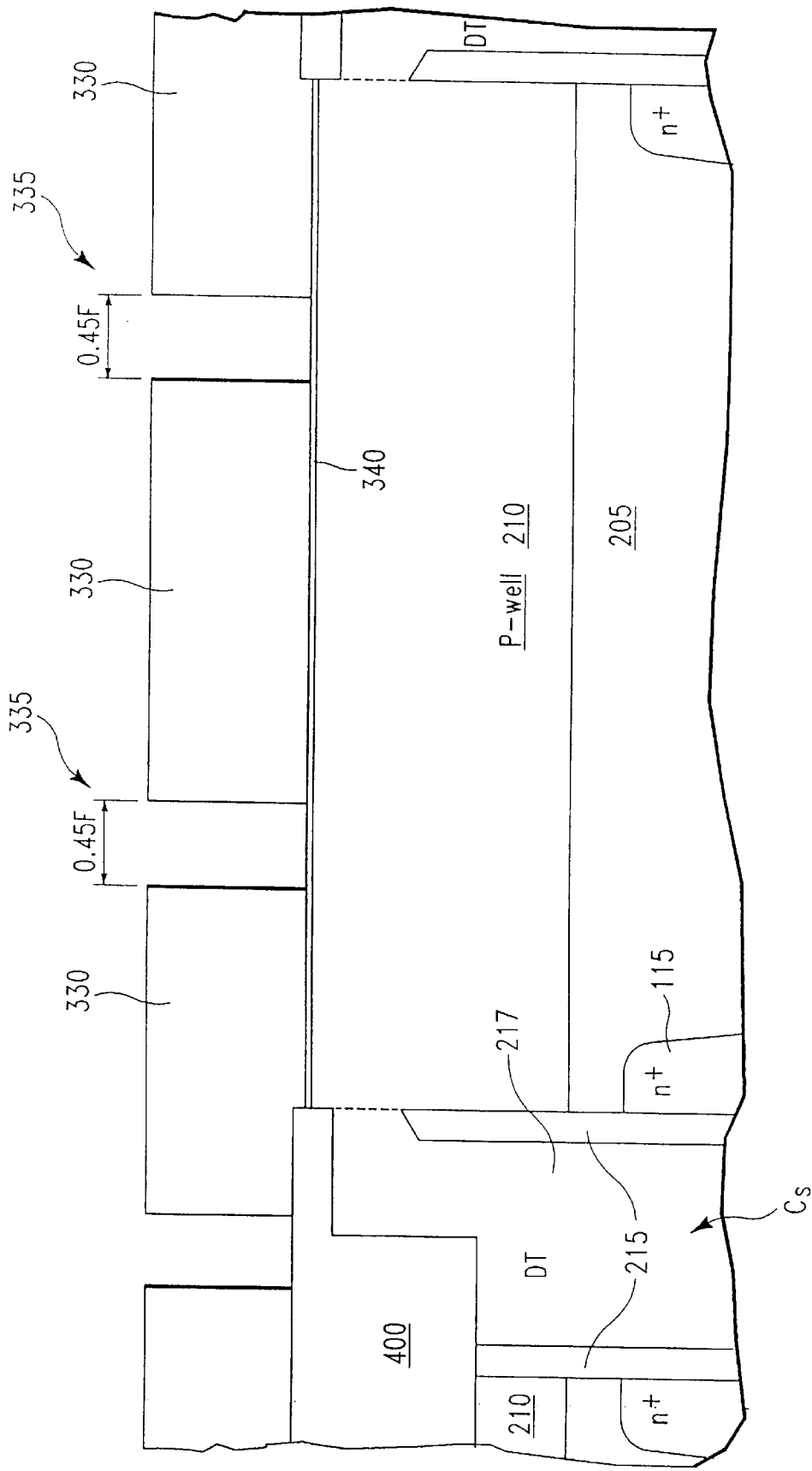
FIGS. 4–6 show a method of forming the memory cell of FIG. 2 according to the present invention.
Figure 5:
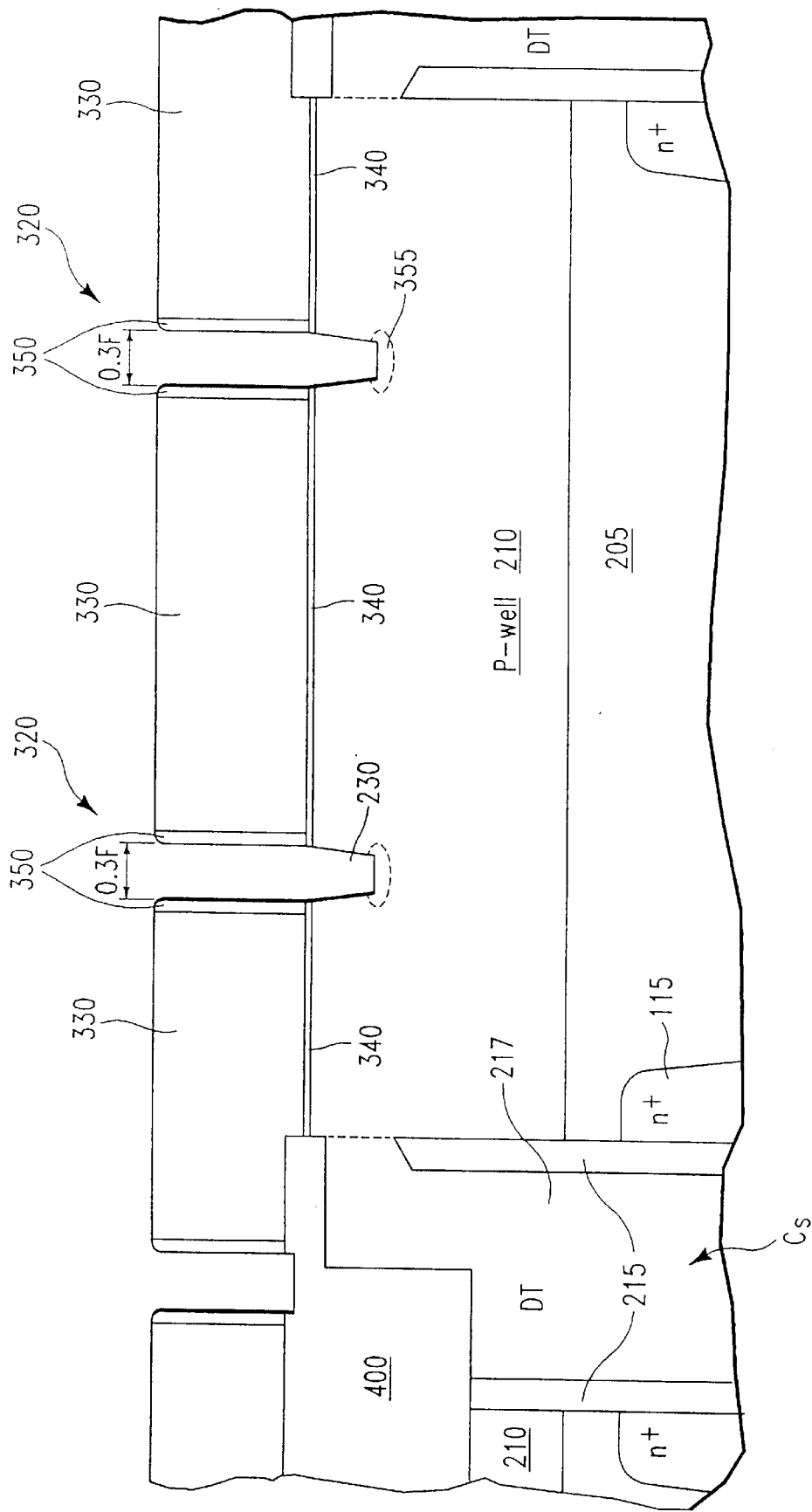
Figure 6:
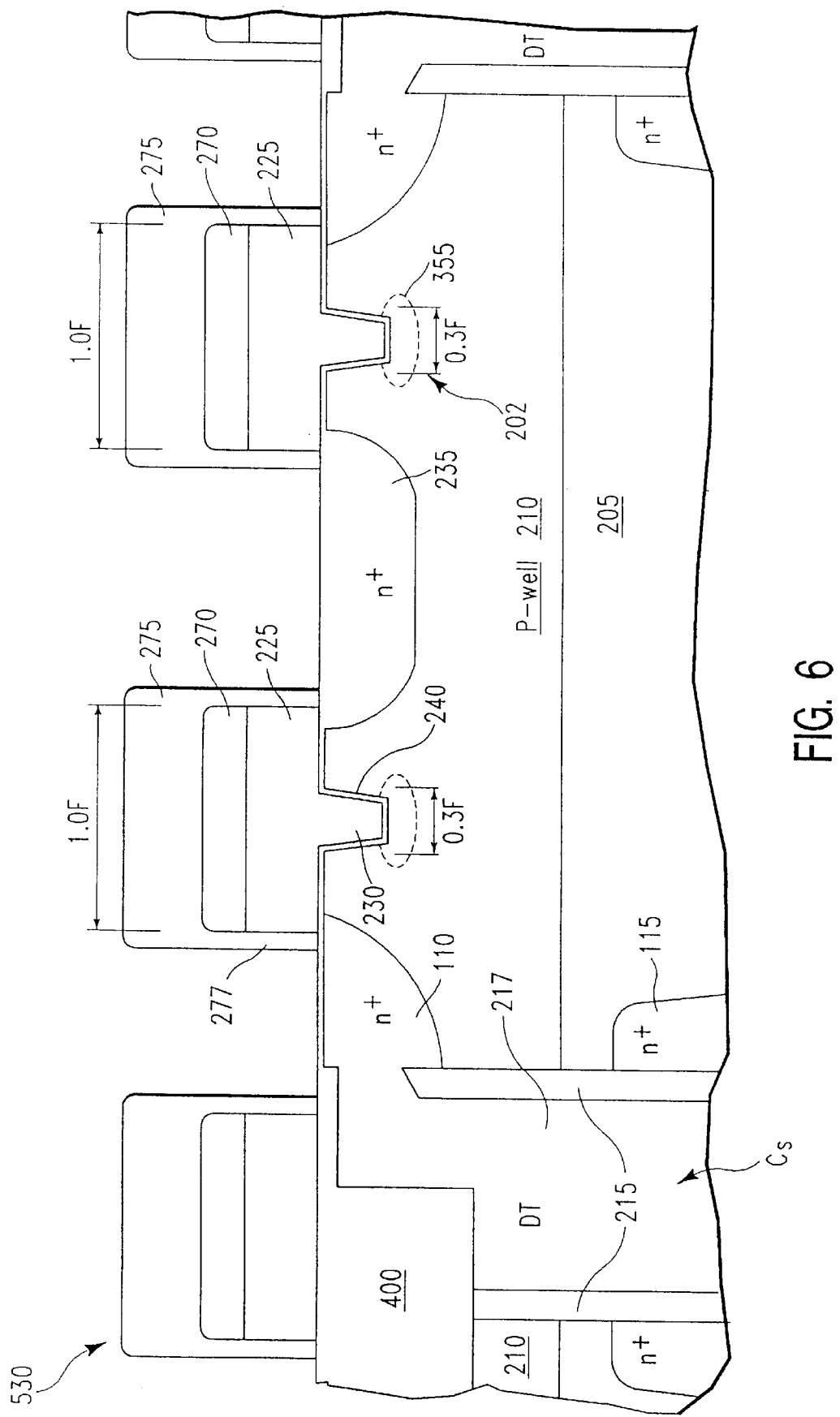

Methods of forming the memory cell 200 according to additional embodiments are described next. The memory cell 200 having the sub-lithographic groove 230 may be formed using self aligned or non-self aligned methods. FIGS. 4–6 show one method of fabricating the memory cell 200. As shown in FIG. 4, a mask 330 is formed over the substrate that includes therein the shallow trench isolation (STI) regions formed over portions of the deep trench capacitor $C_s$.

In particular, as shown in FIG. 4, the deep trench DT is etched into substrate 205 (or the P-well 210) and the storage capacitor plate 115 is formed by outdiffiising $N^+$ dopant from the deep trench DT sidewalls. The node dielectric 212 is formed and the deep trench DT is filled with doped polysilicon. The polysilicon is recessed and the insulating collar 215 is formed on the sidewalls of the deep trench DT, which is then filled with doped polysilicon 217. This polysilicon 217 is also recessed, to expose part of the collar 215, which is oxides of silicon for example. The exposed collar oxide 215 is etched, and the recess filled again with polysilicon which is used to form, e.g. out-diffuse, the strap 110 between the deep trench DT and the source/drain of the transfer device 202.

Next, the shallow trench isolation (STI) regions are formed and planarized (e.g., by chemical polish). After forming and planarizing the STI regions 400, and removing the nitride pad, the hybrid resist mask 330 is applied, exposed, baked and developed to form sub-lithographic strips 335 having a width of approximately 0.45 F. Illustratively, the mask 330 includes alternating strips of positive and negative hybrid resist separated by the sub-lithographic space of approximately 0.45 F to form the exposed strips 335. The mask 330 is formed over an oxide layer 340 which is formed over the P-well 210 between the STI regions 400. Alternatively, phase-shift lithography may be used instead of the hybrid resist.

Next, as shown in FIG. 5, a spacer 350 of approximately 0.08 F is conformally formed over the structure shown in FIG. 4. Illustratively, the spacer 350 is a polymer spacer and is deposited in an etching chamber to narrow the groove opening to approximately 0.3 F and form the exposed strips 320, also shown in FIG. 3. Next, the silicon (of the active region AA shown in FIG. 3), which is exposed through the strips 320, is etched to form the groove 230 into the P-well 210. Illustratively, the groove 230 is etched selectively to oxide after removing the polymer spacer material 350 and portions of the oxide layer 340 located at the bottom of the strips 320. Referring to FIG. 3, areas of the cell array other than the active regions AA are covered by oxide. Accordingly, after forming the strips 320, etching silicon selective to oxide forms the grooves 230 only in the silicon of the active regions AA exposed through the strips 320.

Instead of using the spacer 350 to narrow the opening 335, the grooves 230 are formed using, for example, X-ray, electron beam or other shorter-wave optical lithography. If desired or necessary, for example, to optimize the characteristic of the transfer device or FET 202, the bottom channel portion 355 located below the bottom of the groove is doped, e.g., implanted with impurities.

As shown in FIG. 6, after forming the groove 230, the hybrid resist 330 and spacer 350 are removed. If necessary, a sacrificial oxide layer is grown and etched off to remove any surface damaged by the groove etching. Next, a gate oxide layer 240 is grown to cover the bottom and sidewalls of the groove 230.

After forming the gate oxide layer 240, the gate 225 is formed using conventional photo-lithographic methods. For example, a film of gate conductor material, such as doped polysilicon and tungsten silicide $WSi_x$ formed on the doped polysilicon, is deposited over the wafer substrate, patterned lithographically to define a masked line over the etched groove structure, and subtractively etched to form a gate stack or gate conductor, that includes the doped polysilicon gate 225 and tungsten silicide $WSi_x$ gate wiring 270. The gate stack encompasses the groove 230, where the doped polysilicon gate 225 is formed in the groove 230 and over portions of the substrate adjacent to the groove 230. A nitride cap 275 can be included over the gate conductor stack to serve as isolation material for the borderless bit line contacts 285, for example. Using this method, the groove 230 is not necessarily centered in the middle of the gate 225. That is, the gate 225 and gate wiring 270 are not self-aligned to the groove 230.

Next, $N^+$ regions 110, 235 are implanted and diffused as necessary, and a nitride spacer 277 is formed over sidewalls of the nitride cap 275, gate wiring conductor 270, and the gate 225. Finally, returning to FIG. 2, the oxide layer 280, bit line contact 285 and bit line 290 are formed.

Figure 7:
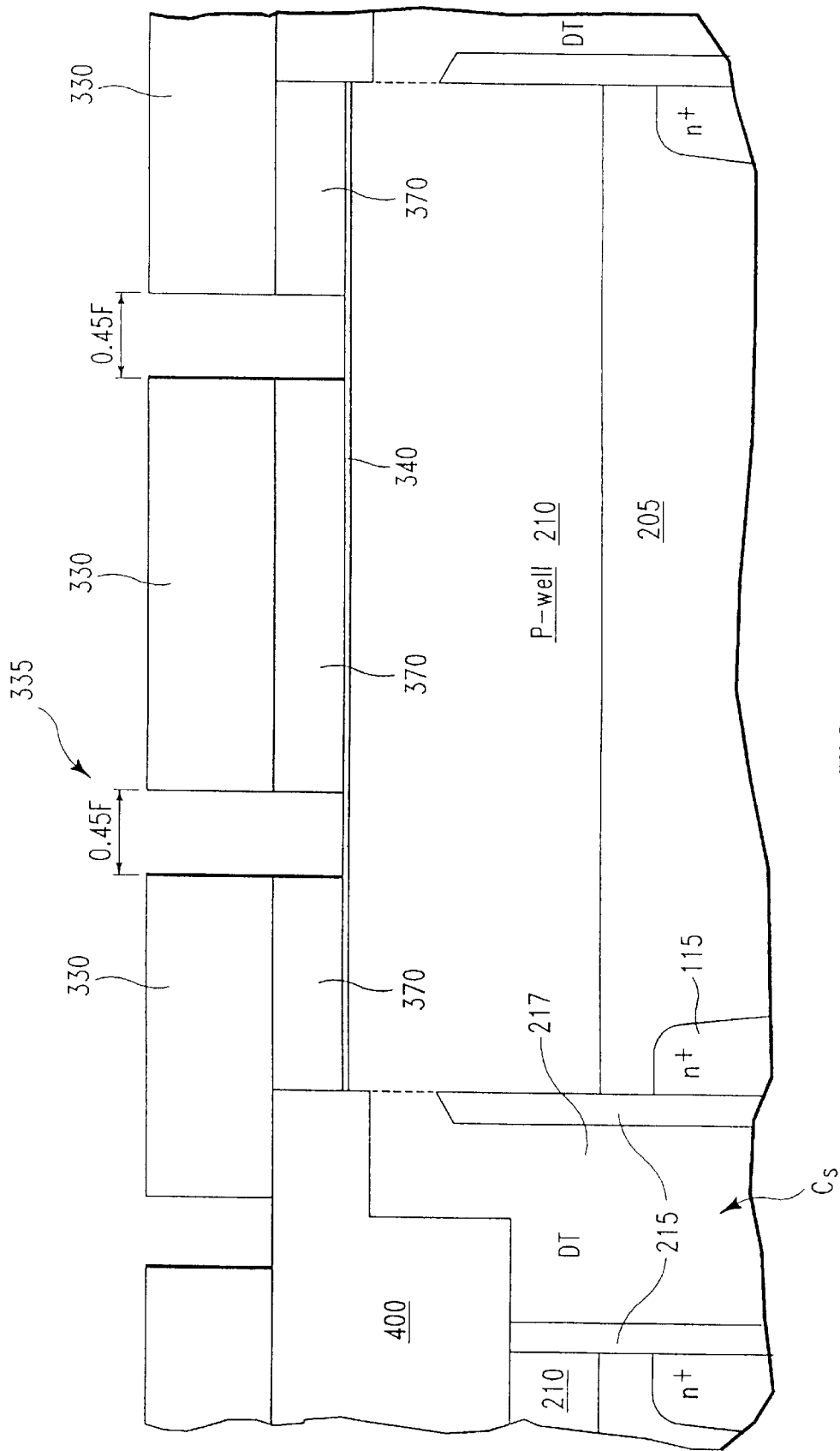
FIGS. 7–8 show another method of forming the memory cell of FIG. 2 according to the present invention.
Figure 8:
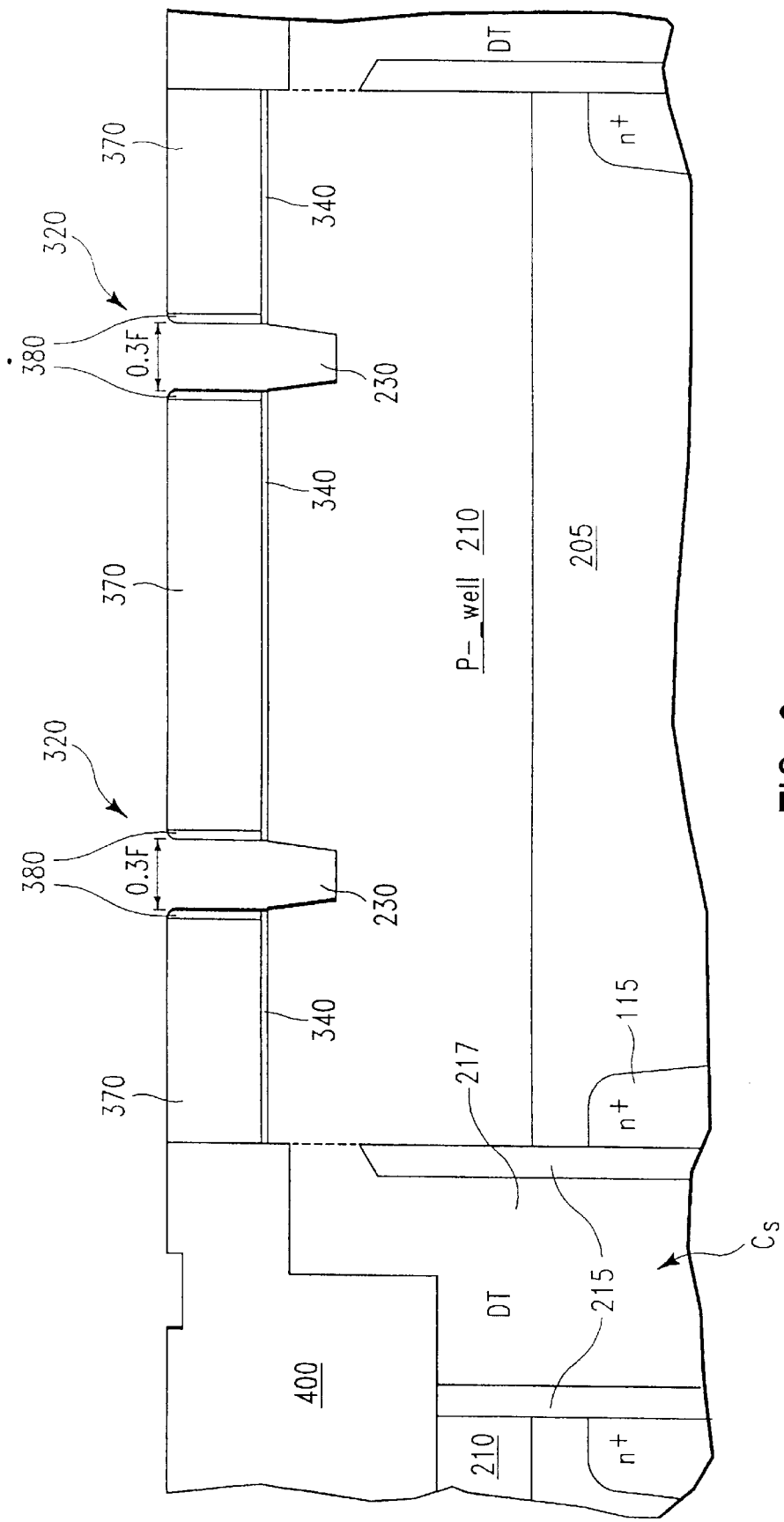

FIGS. 7 and 8 show an alternate method of forming the sub-lithographic grooves 230. As shown in FIG. 7, prior to forming the hybrid resist 330, an insulating layer 370, such as a nitride layer, is formed over the oxide layer 340 that covers the P-well 210 between the STI regions 400. In particular, after planarizing the STI regions 400 to the top of the nitride layer 370, the alternating strips of positive and negative hybrid resist mask 330 are applied over the STI regions 400 and the nitride layer 370. The hybrid resist mask 330 is exposed, baked, developed and the nitride 370 is etched to form the sub-lithographic strips 335 having a width of 0.45 F.

Next, as shown in FIG. 8, the hybrid resist 330 is removed and a spacer 380, such as a nitride spacer, having a width of approximately 0.08 F, is formed over the sidewalls of the nitride layer 370. The spacers 380 located over the sidewalls of the nitride layer 370 narrow the groove opening 335 from approximately 0.45 F to approximately 0.3 F and form the strips 320. Next, similar to that described in connection with FIG. 5, silicon is etched selectively to oxide and nitride after etching through the oxide 340 located at the bottom of the strips 320. This forms the groove 230 into the P-well 210. After the groove 230 is formed by etching, a thin oxide layer is grown to protect the exposed silicon at the bottom of the groove 230 during a subsequent nitride strip.

Next, the nitride spacer and layer 380, 370 are removed. The remaining steps are identical to those described in connection with FIG. 6, where the gate oxide 240, the gate 225, gate wiring 270 and nitride cover 275, as well as the N+ source/drain regions 110, 235, are formed.

Finally, the memory cell 200 shown in FIG. 1, is completed by forming the top oxide layer 280, the bit line contact 285, and the bit line 290. Similar to the first method, this second method which uses the nitride layer 370 also results in a gate 225 and gate wiring 270 which are not self-aligned to the groove 230. That is, the groove 230 is not necessarily centered in the middle of the gate 225.

Figure 9:
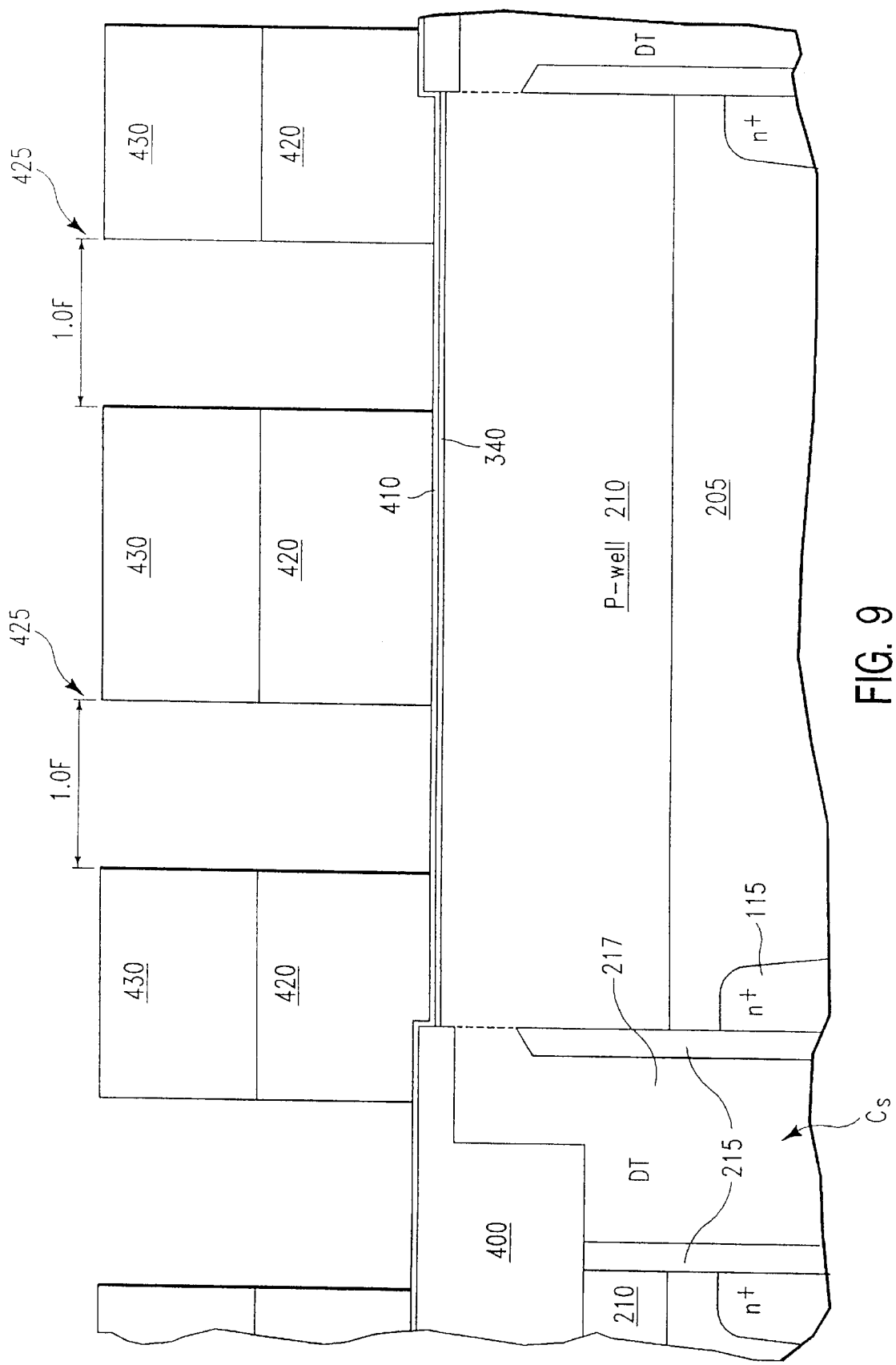
FIGS. 9–11 show yet another method of forming the memory cell of FIG. 2 according to the present invention.
Figure 10:
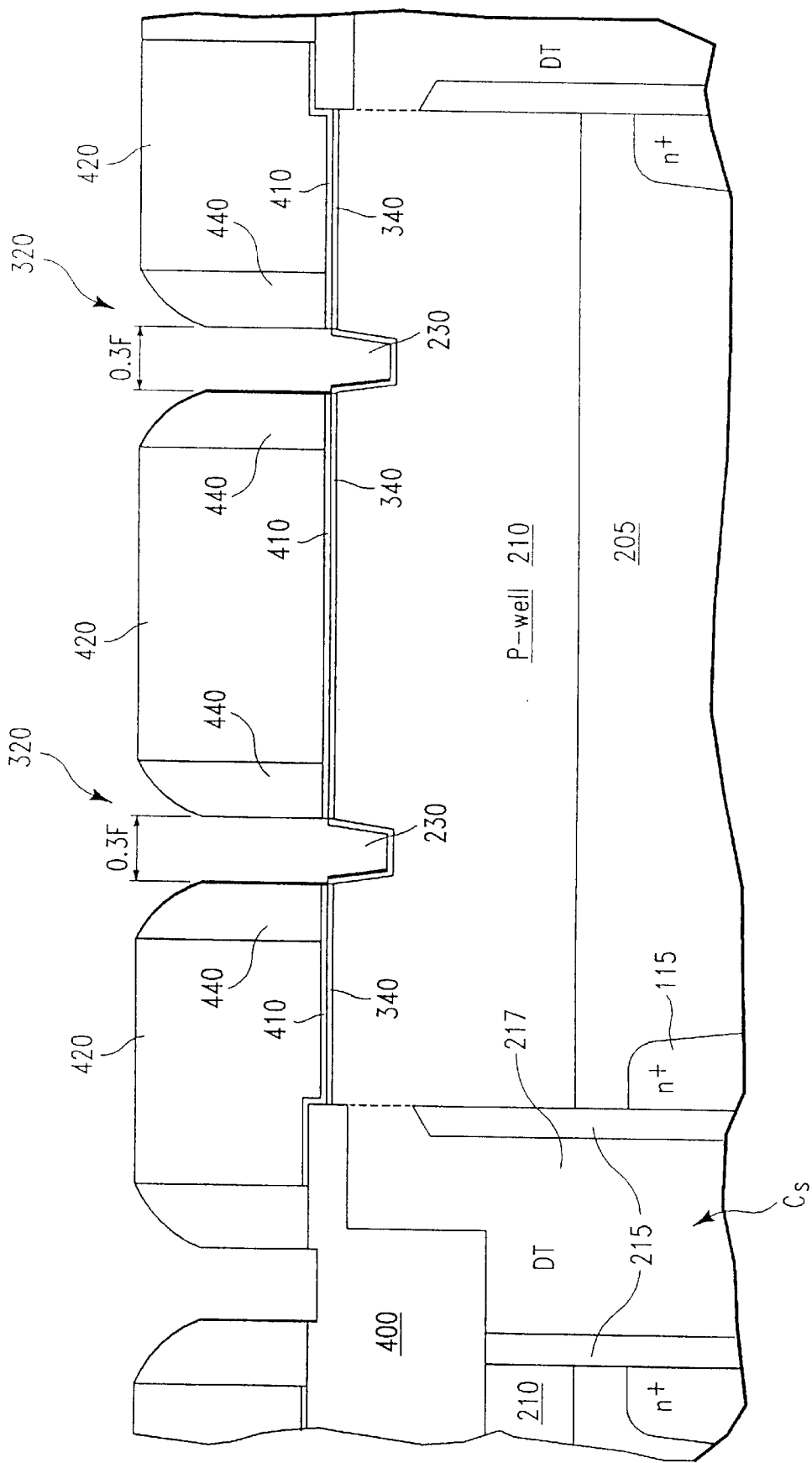
Figure 11:
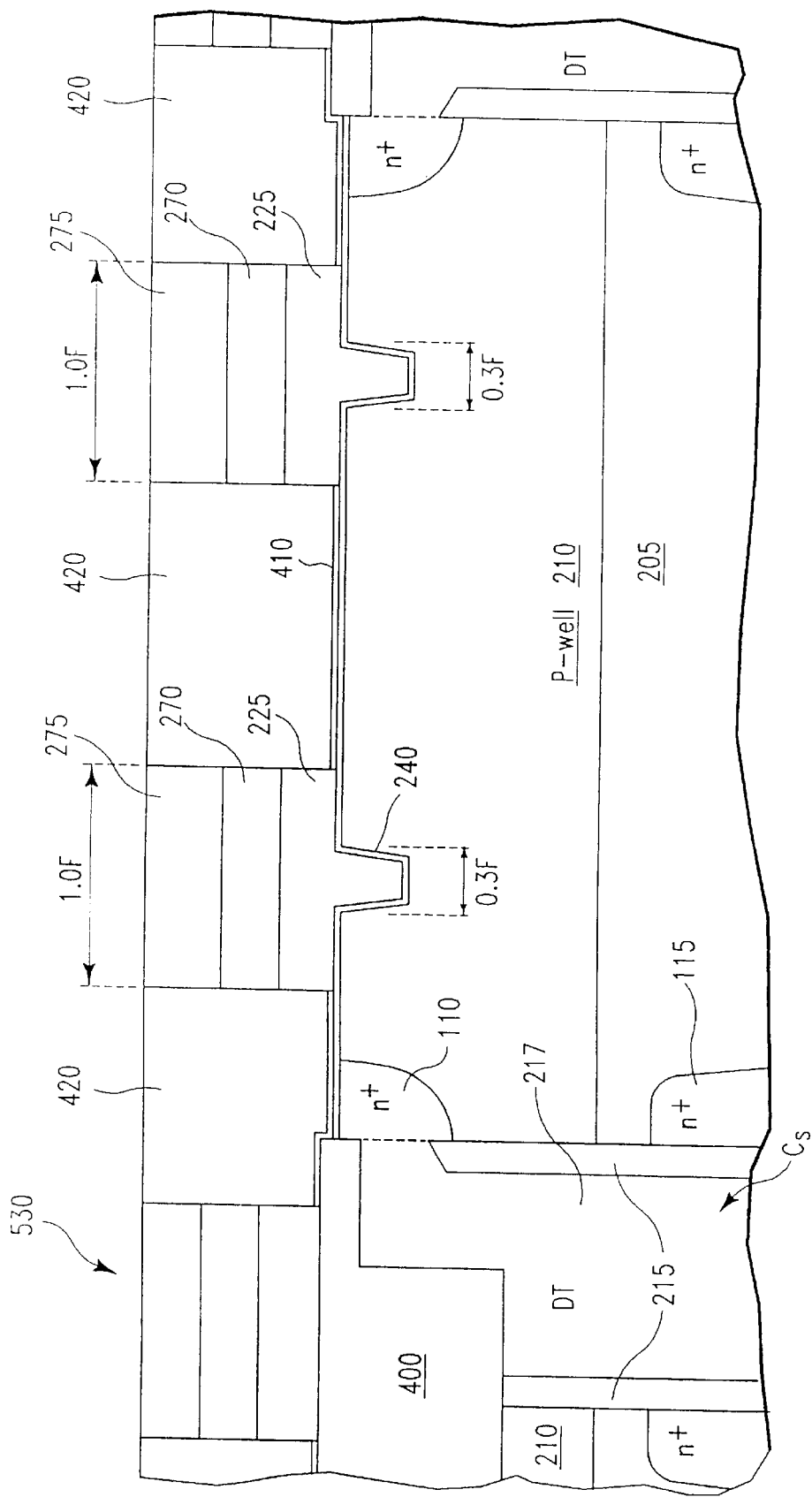

FIGS. 9–11 show another method according to another embodiment, where the groove 230 is self-aligned to the gate 225. This method includes a combination of sub-lithographic and Damascene word-line process steps to create the sub-lithographic sized and self-aligned groove 230 under the gate 225 of the transfer device 202 (FIG. 2). Damascene word-line process refers to etching trenches in an insulator layer, such as an oxide layer, and filling the trenches with a gate conductor to form the word-line in the trenches. Excess gate conductor formed outside the trenches are removed, e.g., using chemical mechanical polishing (CMP). The Damascene word-line process is in contrast to another method of forming word-lines, where the gate conductor is blanket deposited on the insulator layer and patterned with a subtractive etch, as described in connection with FIG. 6, to form the word-lines.

As shown in FIG. 9, the deep trench capacitor $C_s$, the N+ capacitor plate 115, the P-well 210, and the STI regions 400 are formed in the substrate using steps which are identical to that described in connection with FIG. 4. After planarizing the STI regions 400 and removing the patterned nitride pad used as a CMP stop mask to form the STI regions 400, a thin nitride liner 410 is formed, e.g. deposited, over the substrate. As described below, the nitride liner 410 acts as an etch stop during subsequent etching. Next, a thick oxide layer 420 is formed, e.g. deposited, over the nitride etch stop 410.

The oxide layer 420 is etched to expose portions 425 of the nitride etch stop 410 using photo-lithographic steps, such as forming a photo resist mask 430 over the oxide layer 420. The mask 430 is patterned to expose portions of the oxide layer 420, which portions are etched to expose the portions 425 of the nitride etch stop 410. As shown in FIG. 9, the exposed portions 425 of the nitride etch stop 410 have a width of 1F, where F is the minimum lithographic feature size.

Next, the mask 430 is removed and, as shown in FIG. 10, nitride spacers 440 are formed on the sidewalls of the oxide layer 420. Illustratively, the nitride spacer 440 has a thickness of approximately 0.35 F and forms the groove strips 320, shown in FIGS. 3 and 10, having a width of approximately 0.3F. As described in connection with FIG. 8, the groove 230 is etched selectively to nitride and oxide into the silicon of the P-well 210, which is in the active area AA shown in FIG. 3.

Next, the nitride spacer 440 is removed and, as shown in FIG. 11, the gate oxide 240 is formed to cover the sidewalls and bottom of the groove 230, similar to that described in connection with FIG. 6. As described in connection with FIG. 6, if necessary, the portion of the channel in the P-well 210 located at bottom of the groove (shown in FIG. 6 as reference numeral 355) is implanted to improve the performance of the FET 202. In addition, if necessary, a sacrificial oxide layer is grown and stripped prior to forming the gate oxide 240. The reason for the sacrificial oxide layer is to remove any silicon surface defects created by prior processing steps.

As shown in FIG. 11, and similar to previously described embodiment, after gate oxidation to form the gate oxide 240, the gate stack shown in FIG. 2 and 6 is formed. In particular, intrinsic polysilicon is deposited in the opening 425 (FIG. 9) formed in the oxide layer 420, which opening has a width of 1 F after removal of the nitride spacers 440 (FIG. 10). The polysilicon 225 is planarized and recessed below the top surface of the oxide layer 420. The recessed intrinsic polysilicon is implanted with impurities to dope the intrinsic polysilicon and form the gate 225. Alternately, in-situ doped polysilicon may be used.

After polysilicon implantation, the gate wiring 270 is deposited over the gate polysilicon 225 and planarized to the top surface of the oxide layer 420. Thereafter, the planarized $WSi_x$ or W layer 270 is recessed to form the gate wiring 270. Illustratively, the gate wiring 270 is made of tungsten silicide ($WSi_x$) or tungsten (W). Next, a thick nitride layer 275 is deposited and planarized to form the nitride cap 275.

Next, the oxide layer 420 and nitride liner 410 are etched off and the structure shown in FIG. 6 is formed by implanting and diffusing impurities in the P-well 210 to form the N+ source/drain regions 110, 235. Thereafter, as shown in FIG. 6, the nitride spacer 277 is formed on sidewalls of the nitride cap 275, gate wiring conductor 270, and the gate 225. Illustratively, the nitride sidewalls are formed by a blanket nitride deposition, which is then etched and removed except for the nitride at the sidewalls of the nitride cap 275, gate wiring conductor 270, and the gate 225. Thereafter, as described above and shown in FIG. 2, the oxide layer 280, borderless bit line contact 285 and bitline 290 are formed.

Figure 12:
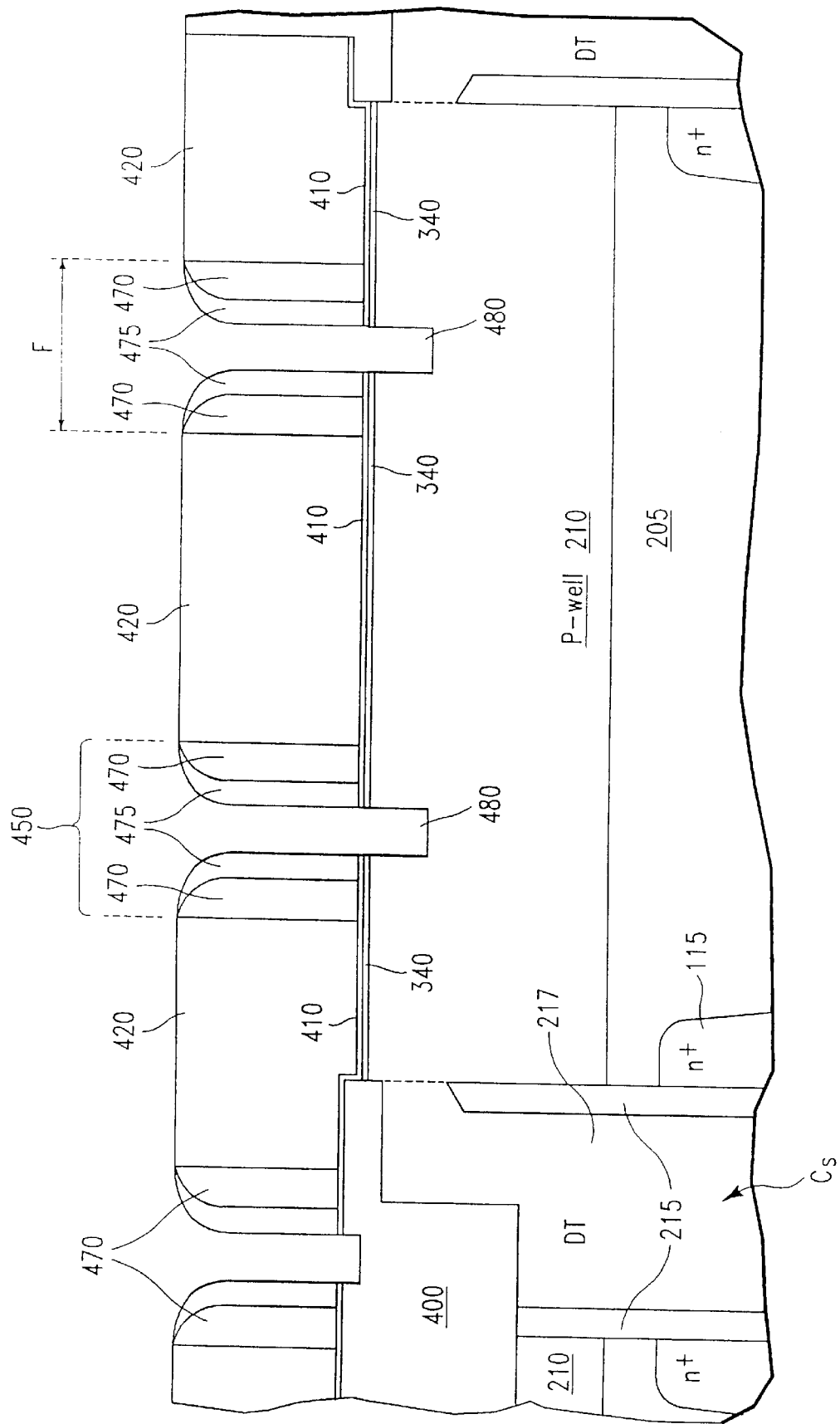
FIGS. 12–14 show a method of forming a stepped groove according to another embodiment of the present invention.
Figure 13:
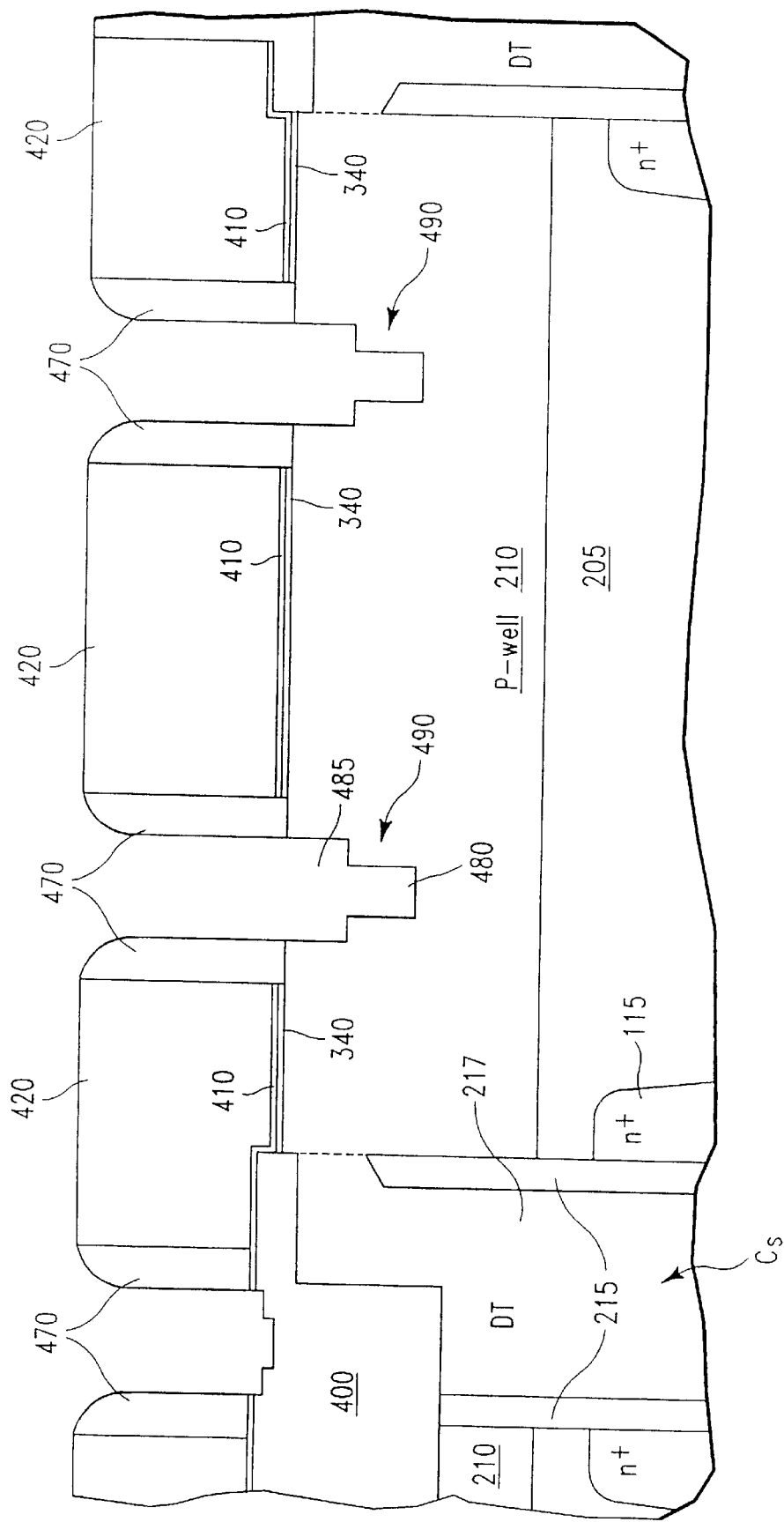
Figure 14:
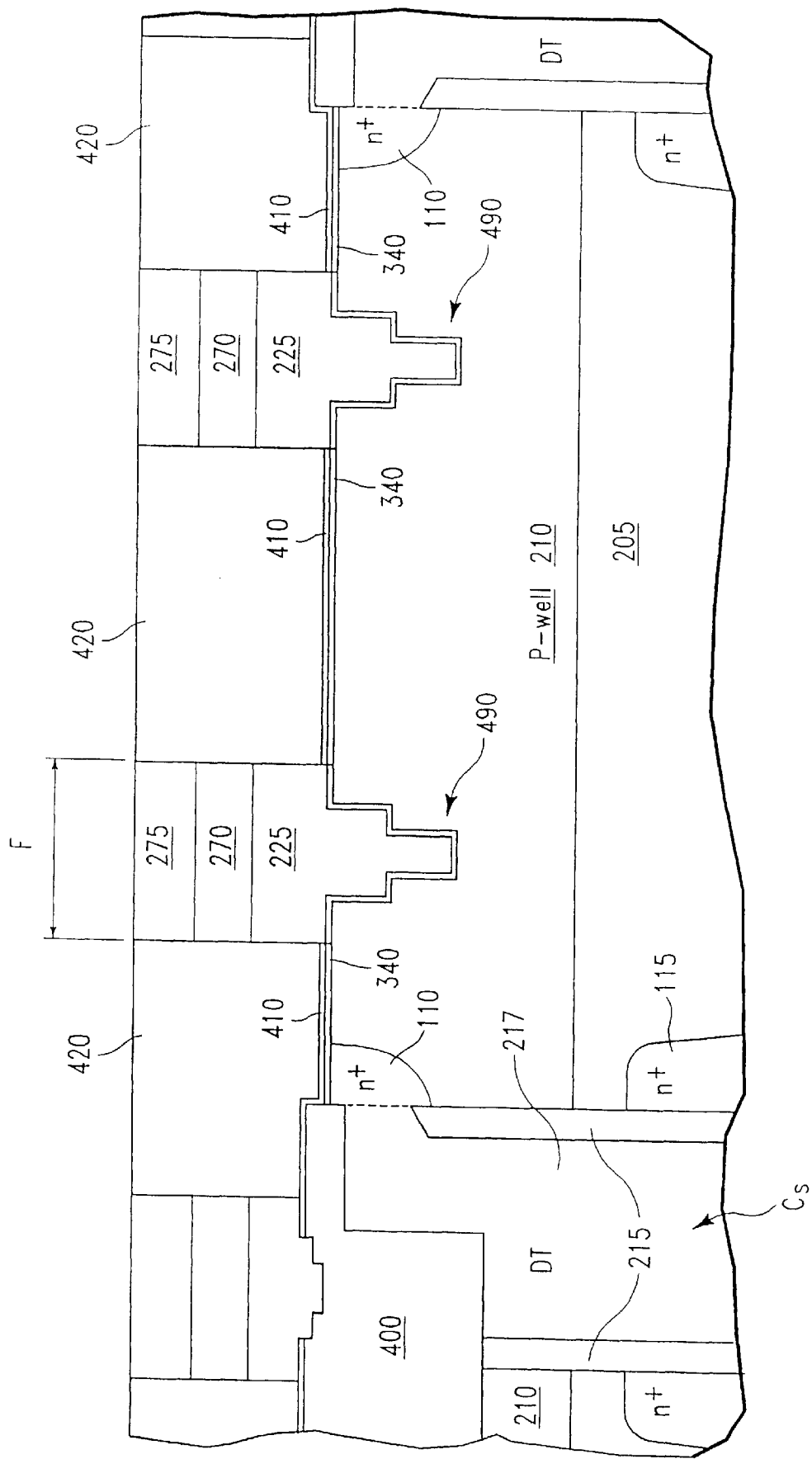

According to another embodiment as shown in FIGS. 12–14, a stepped groove (shown in FIG. 14 as reference numeral 490) may be formed instead of the groove 230 shown in the previous figures. As previously described in FIG. 9, a stack of dielectric layers, having a nitride 410 and oxide 420 layers, and a photo-resist mask layer 430 (FIG. 9), are formed over the substrate that includes the deep trench capacitor $C_s$ and STI regions 400. The oxide layer 420 is patterned and etched, as described above using a patterned mask, for example, to expose portions 450 of the substrate. This is similar to that shown in FIG. 9, where the width of the exposed portion 450 is one lithographic feature size F.

As shown in FIG. 12, the opening 450 is exposed using conventional lithography to pattern the Damascene gate structure in the oxide layer 420, using the resist mask 430 (FIG. 9) which is exposed and developed, and the resist pattern is etched to remove portions of the oxide layer 420. After the resist mask is removed, a first spacer forming material, such as nitride, is deposited and anisotropically etched to form nitride spacers 470 on sidewalls of the oxide layer 420 for narrowing the width of the first openings 450 to result in second openings 485 (FIG. 13).

After the nitride spacers 470 are formed, second spacer forming material, preferably polymer spacer forming material such as parylene, is deposited and anisotropically etched to form polymer spacers 475 on sidewalls of the nitride spacer 470 for further narrowing the second openings 485 to result in third openings 480, shown in FIGS. 12 and 13. The thicknesses of the two deposited spacer forming materials are chosen such that the nitride and polymer spacers 470, 475 have a desired width, so that the widths of the successively narrower openings 480, 485 (FIG. 13) are the desired dimension of the groove 490 to be formed in the substrate or P-well 210.

Next, as shown in FIG. 12, the first groove 480 is etched into the P-well 210, using the combination of the oxide 420, nitride spacers 470, polymer spacers 475 and STI oxide 400 as an etching mask. After forming the first groove 480, the polymer spacers 475 are removed, and the exposed silicon substrate is etched into the P-well 210, using the combination of oxide 420, nitride spacers 470, and STI oxide 400 as the etching mask. This transfers the wider portion of the groove 485 into the P-well 210, while the narrow portion of the groove 480 is further etched deeper into the P-well 210 to form a stepped groove 490.

Next, the nitride spacers 470 and oxide layer 340 are removed to expose the wide opening 450 (FIG. 12). The remaining steps that form the gate stack structure shown in FIG. 14, as well as further steps to complete the device structure, are identical to those described in connection with FIG. 11 and, for brevity, will not be repeated.

Forming the stepped groove using the above described method provides the stepped groove structure 490 which is easier to fill with polysilicon. Further, the stepped groove 490 provides formation of a narrower and deeper groove gate so that the effective channel length is further increased. Multiple spacers, i.e, more than the two spacers 470, 475 (FIG. 12) described above, may be used to make a stepped groove having multiple steps to eliminate polysilicon filling problems for a narrow and deep groove gate formation.

Figure 15:
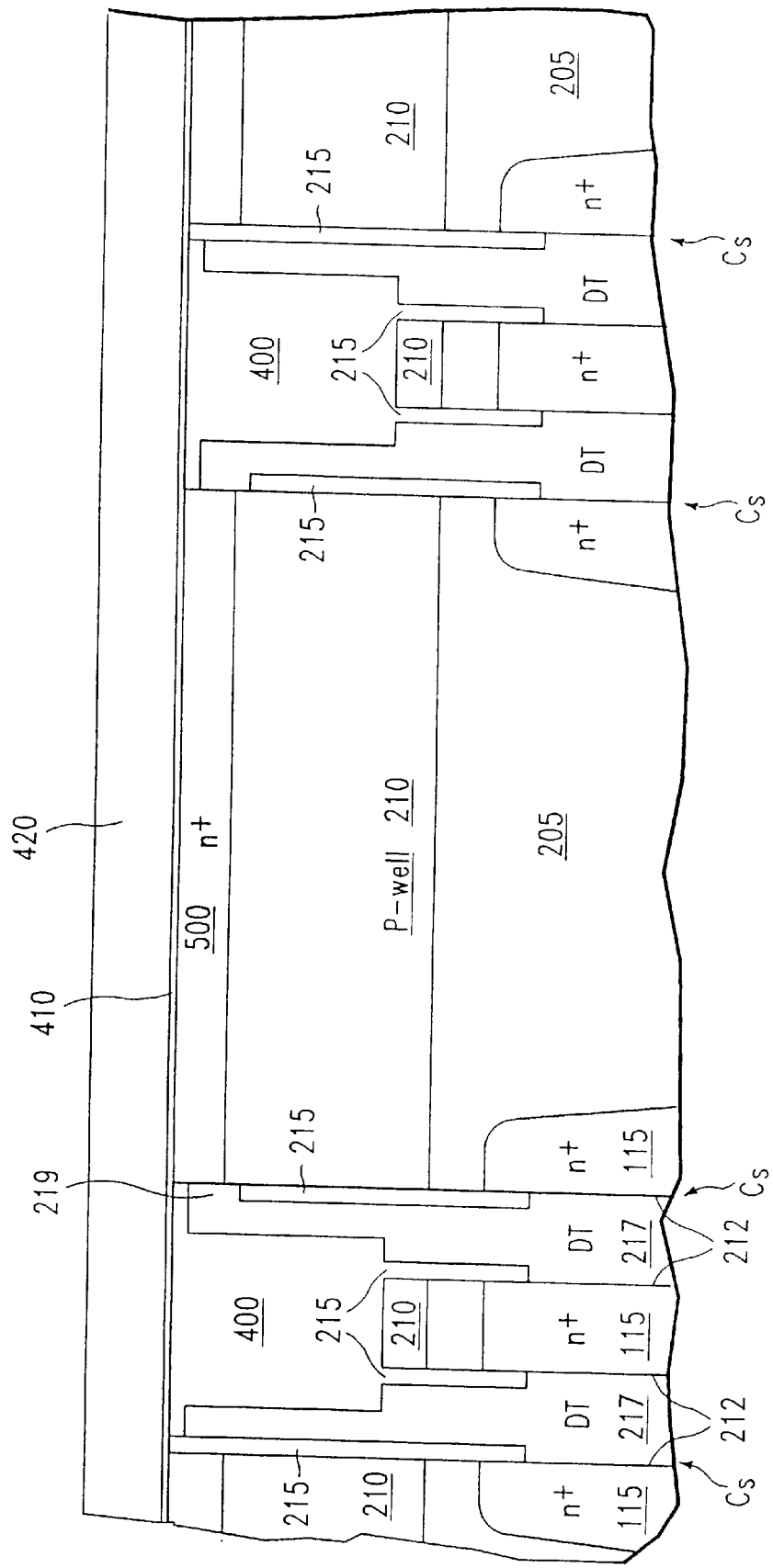
FIGS. 15–19 show another method of forming a memory cell according to yet another embodiment of the present invention.

In another embodiment of the present invention, a memory cell is formed having a grooved Damascene gate with pre-formed source/drain diffusion regions. FIG. 15 shows a cross section of a memory cell processed up to the formation of the P-well 210 and an N$^+$ doped layer 500 where, as previously described, an N$^+$ capacitor plate 115 is formed and deep trench processing performed to form the deep trench capacitor $C_s$ in the deep trench DT.

The deep trench DT is lined with node dielectric layers 212. The upper portion of the deep trench DT, is lined with the oxide collar 215. Next, the deep trench DT is filled with polysilicon 217. On one side of the deep trench DT, the oxide collar 215 does not line the top portion of the deep trench DT to leave the unlined portion 219 so that the buried strap 110 (FIGS. 2, 18) to be formed contacts the polysilicon 217 in the deep trench DT. Next, the STI regions 400 are formed. Thereafter, impurities are implanted in the substrate 205 to form the P-well 210 similar to that described in connection with FIG. 4.

Unlike the previously described methods, impurities are implanted or diffused in the P-well 210 to form a heavily doped N$^+$ layer 500 in the P-well 210 prior to forming the groove and gate. This heavily doped N$^+$ layer 500 will be used to later form the source/drain regions 110, 235 of the FET 202, shown in FIG. 2.

As shown in FIG. 15 and similar to that described in connection with FIG. 9, after forming the heavily doped N$^+$ layer 500, a thin nitride etch stop layer 410 is formed over the entire structure, i.e., over the heavily doped N+layer 500, the deep trench DT, and the STI regions 400. Next, a silicon oxide layer 420 is formed over the nitride layer 410. Illustratively, the nitride and oxide layers 410, 420 are formed by chemical vapor deposition (CVD).

Figure 16:
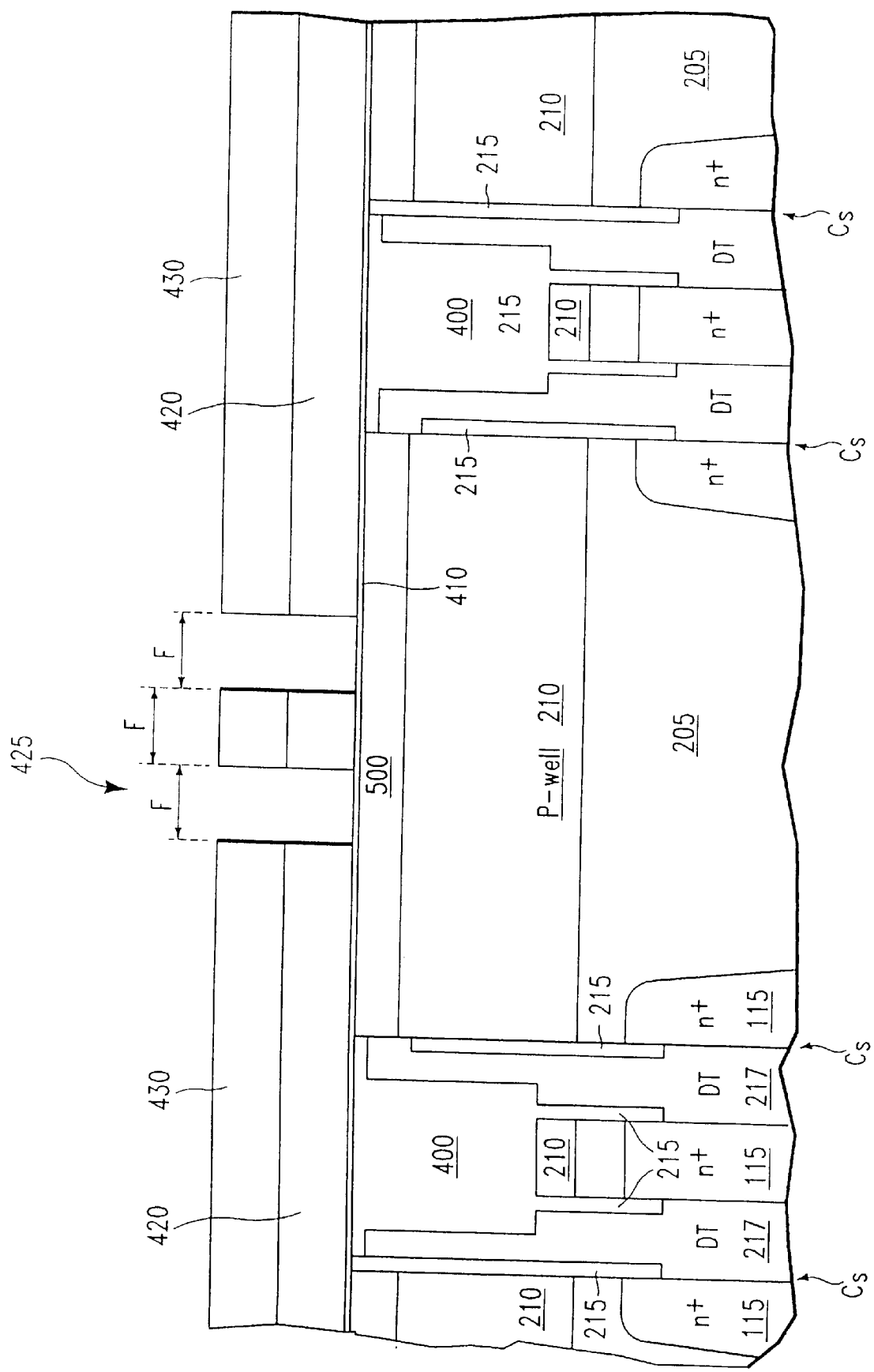

As shown in FIG. 16, a conventional photo-resist mask 430 is applied over the oxide layer 420. Similar to FIG. 9, the mask 430 is patterned, exposed and etched to expose portions 425 of the nitride liner 410, which portions 425 have a width of 1 F of more, for example.

Figure 17:
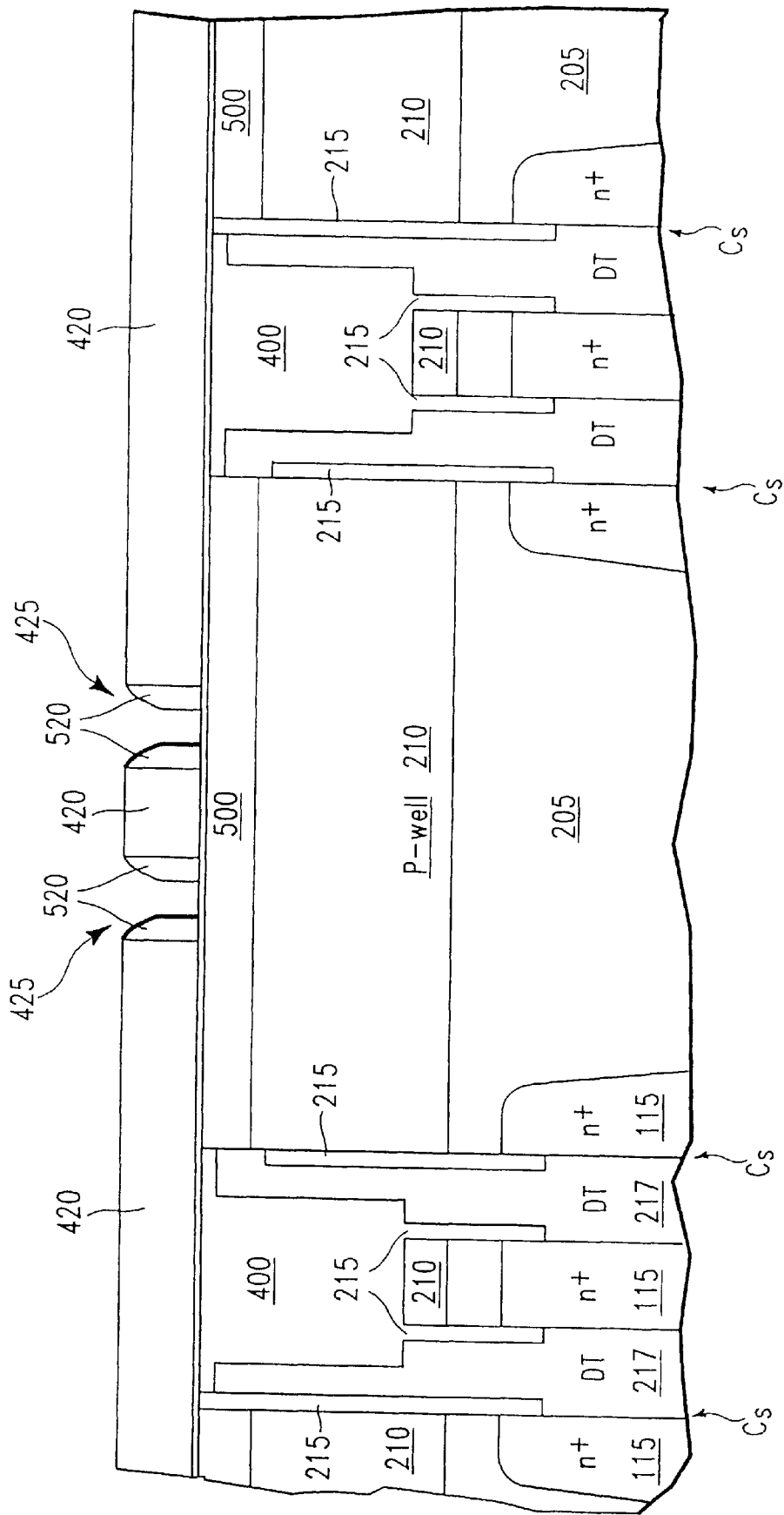

Similar to that described in connection with FIG. 10, the mask 430 is removed to expose the oxide layer 420, and a nitride layer is formed, e.g. by CVD, over the top and sidewalls of the oxide layer 420. Next, as shown in FIG. 17, the portions of the nitride layer located over the top of the oxide layer 420 and bottom of the opening 425 are removed. The remaining nitride at the sidewalls of the oxide layer 420 form nitride spacers 520 that narrow the width of the opening 425 to a desired size due to the spacer thickness, which is related to the thickness of the deposited nitride layer.

Figure 18:
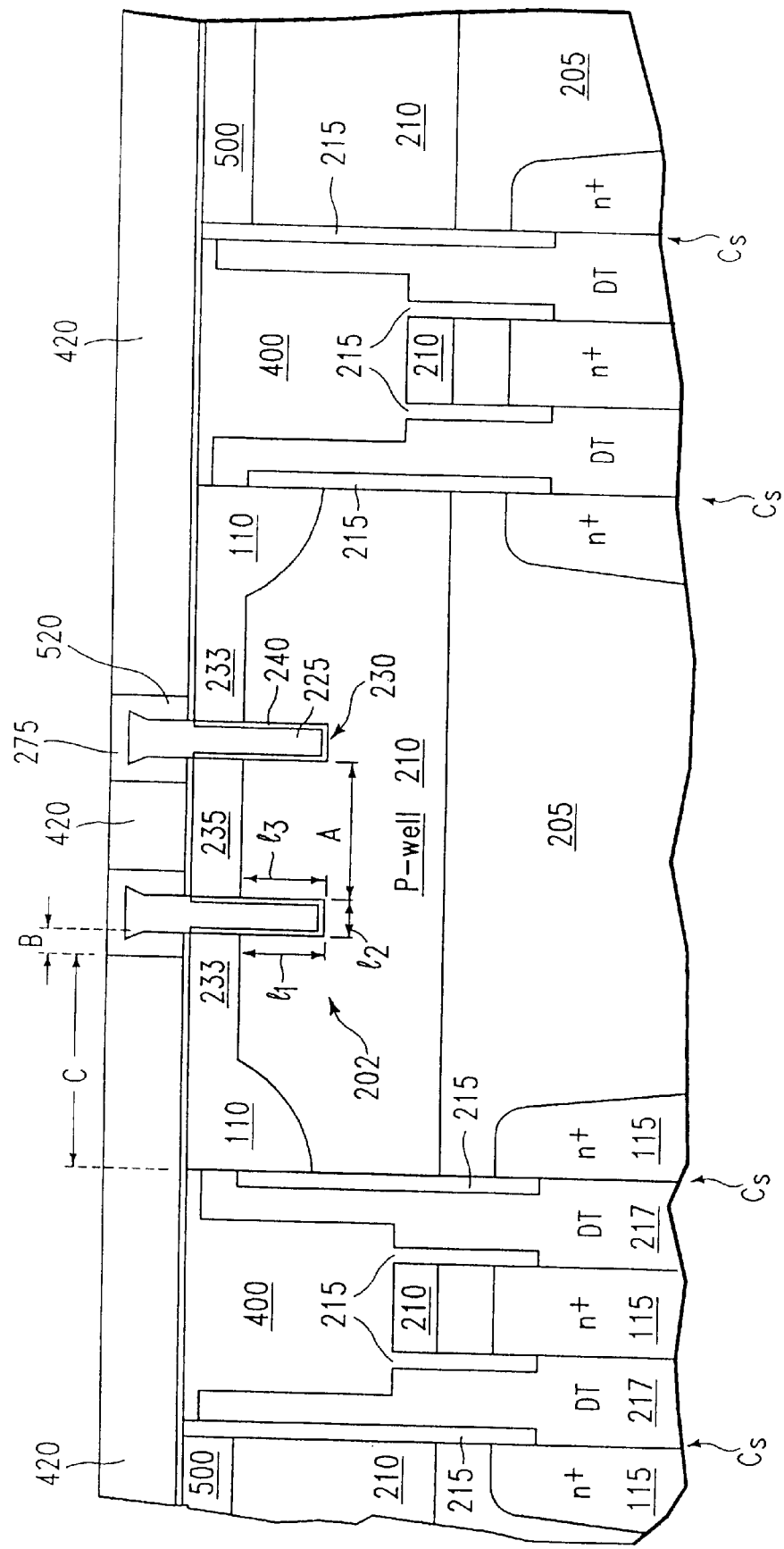

As shown in FIG. 18, the groove 230 of the transfer device or FET 202 is formed by etching into the P-well 210 through the nitride lined opening 425. This groove 230 is self-aligned in the center of the lithographic gate conductor mask 430 shown in FIG. 16. As with the previously described methods, if desired or necessary, a sacrificial oxide is formed and stripped. The sacrificial oxide is formed in order to repair any surface damage resulting from prior processing steps. The groove 230 separates the N$^+$ layer 500 (FIG. 17) into regions 233, 235 that act as the source and drain of the FET 202. Next, the gate oxide 240 is formed to line the groove 230 and the gate stack is formed as previously described. N$^+$ dopant is diff-used from the N$^+$ polysilicon 217 in the deep trench DT through the collar oxide opening 219 to form the buried strap 110, which connects the N$^+$ polysilicon 217 in the deep trench DT to the N$^+$ diffusion region 233.

Figure 19:
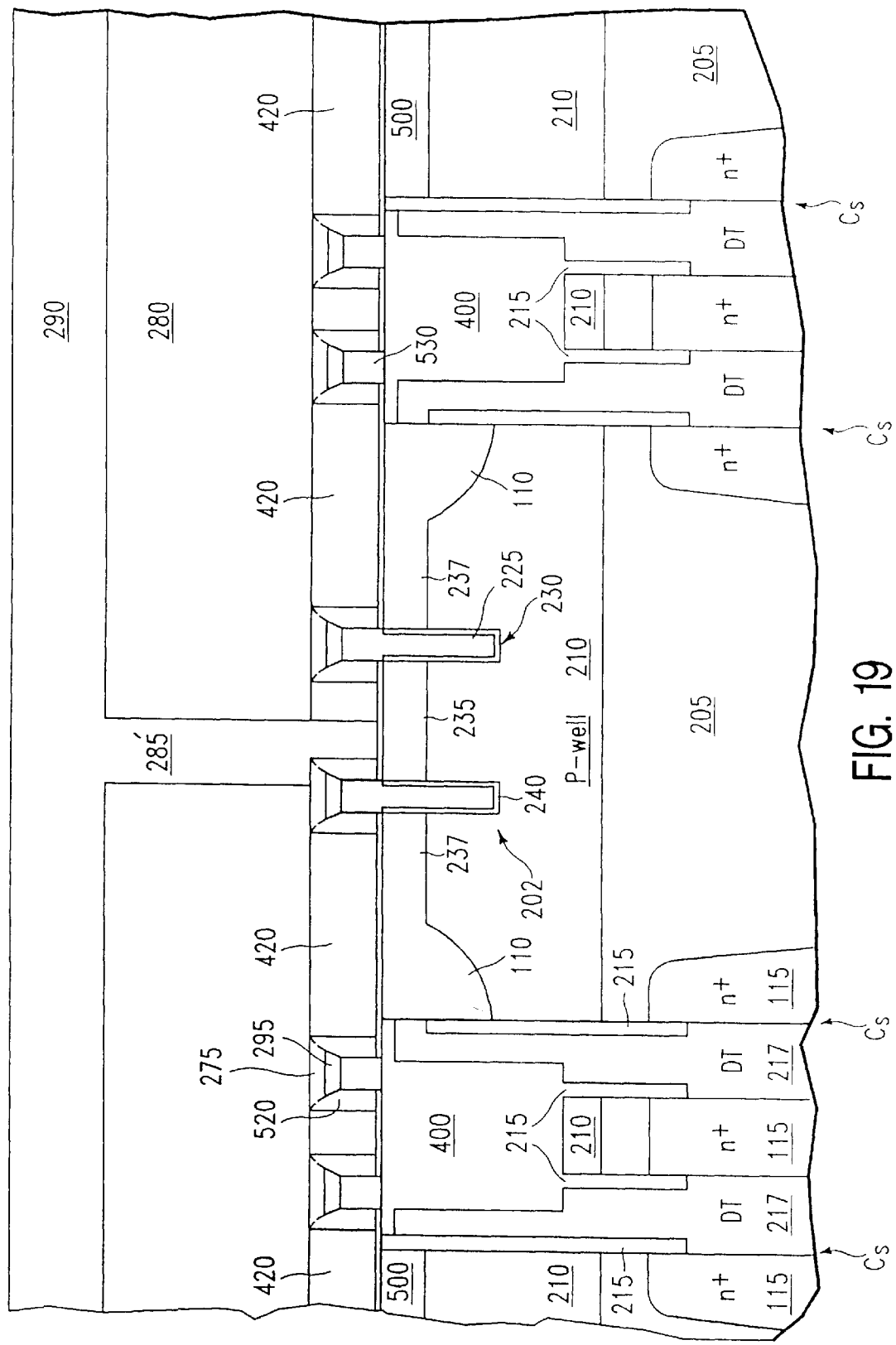

As shown in FIGS. 18 and 19, a gate structure for a borderless bitline contact 285' can be formed by filling the groove 230 with doped polysilicon fill 225, planarizing the gate polysilicon and recessing it into the groove 230. As shown in FIG. 18, a nitride cap 275 is formed, e.g., by chemical vapor deposition (CVD) of nitride, over the recessed polysilicon 225, and planarized, e.g., by chemical mechanical polishing (CMP) to the top surface of oxide 420.

As shown in FIG. 19, to form the bit-line contact 285', an insulator 280 (also shown in FIG. 2), such as an oxide, is deposited over the oxide layer 420, and patterned. The two oxide layers 280 and 420 are etched selective to the nitride spacer 520 and nitride cap 275, to expose portions of the source/drain diffusion region 235. Next, the exposed source/drain diffusion region 235 is filled with a conductive material to form the borderless bit line contact 285'. This bit line contact 285' is referred to as borderless because the bit-line contact 285' can overlap the gate stack, but by using the selective etch process, the borderless bit line contact 285' does not electrically contact the gate stack as shown in FIG. 2 as well as in FIG. 19. In addition, as described in connection with FIG. 2, the bit-line 290 is formed over the oxide layer 280 to connect various bit line contacts 285' of different memory cells in the array 300 shown in FIG. 3.

If desired or necessary, the resistance of the word-line or gate 225 may be reduced by first forming a salicide layer 295 on the recessed poly 225, and then forming the nitride cap 275. In addition, as described earlier and shown in FIGS. 5 and 6 as numeral 355, if necessary, the portion of the channel in the P-well 210 located at bottom of the groove is implanted to improve the performance of the FET 202.

It is understood by those skilled in the art, that in addition to forming the two word-lines 225 in the two groove 230, passing word-lines 530, shown in FIGS. 2, 6 and 11, are also formed over the STI regions 400 that cover the deep trench capacitors $C_s$. As shown in FIG. 3, the strips 320 shown in the top view layout 300 of the array of memory cells are word-lines for the memory cells formed in the active areas AA, and are passing word-lines outside the active areas AA, e.g., when passing over the deep trenches DT of other cells. As described in connection with FIG. 3, the grooves are etched selectively into the substrate or P-well only in the active areas AA.

As shown in FIG. 18, the distance A between adjacent FETs 202 or grooves 230 is larger than the minimum lithographic feature size F. The thickness B of the spacers 520 is adjusted to make an optimum grooved device. As the spacer thickness B increases, the width of the groove is reduced, and the distance A (or the back-to-back distance that separates the FETs from each other) is increased.

The distance C between the spacer 520 and the deep trench DT used for forming the deep trench capacitor $C_s$ and STI regions 400 may be decreased to less than 1 F for an even smaller cell.

Note that in all embodiments, additional conventional processing steps are performed to complete support devices and circuitry on the periphery of the memory cell array.

The groove increases the effective channel length by at least twice the depth of the groove from the bottom of $N^+$ source/drain diff-usion regions 233, 235 without increasing the lateral dimension of the gate. In particular, the effective channel length is the sum of lengths $1_1$, $1_2$ and $1_3$ shown in FIG. 18.

Thus, without any lateral increase in size, the device having the grooved gate has less sub-threshold leakage from the storage node or strap 110 to the bit-line 290, i.e. between the two implanted heavily doped regions 237, 235 (FIG. 10) forming the drain and source of the FET 202 or transfer device of the DRAM memory cell. The reduced leakage increases retention time of the inventive memory cell. Increased channel length also eliminates the need to increase the channel doping concentration, thereby avoiding excessive junction leakage.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method of fabricating a semiconductor device comprising the steps of:
   forming in a substrate a groove having a sub-lithographic width;
   forming a grooved gate in said groove, said grooved gate having sidewall portions and a bottom portion, and defining a channel located in said substrate along said gate sidewall and bottom portions, wherein sidewall sections of said channel located along said gate sidewall portions have a larger length than a bottom length of a bottom section of said channel located along said gate bottom portion; and
   forming first and second regions in said substrate on opposite sides of said grooved gate, respectively.

2. The method of claim 1 further comprising forming an isolation region in said substrate to isolate said semiconductor device, said isolation region having a depth which is greater than a depth of said groove.

3. The method of claim 1 further comprising forming a deep trench capacitor in said substrate, said deep trench capacitor having a storage electrode electrically connected to one of said first and second regions.

4. The method of claim 1 further comprising forming a doped well region located between said substrate and said groove.

5. The method of claim 1, wherein the groove forming step includes the steps of:
   forming a mask over said substrate;
   patterning said mask to expose sub-lithographic portions of said substrate;
   forming spacers over sidewalls of said mask to reduce a width of said exposed sub-lithographic substrate portions; and
   etching said reduced sub-lithographic substrate portions to form said groove.

6. The method of claim 5, wherein the mask forming step forms a hybrid resist mask.

7. The method of claim 5, wherein the spacers forming step forms polymer spacers.

8. The method of claim 5, prior to the mask forming step, further comprising forming an oxide layer over said substrate.

9. The method of claim 1, wherein the groove forming step includes the steps of:
   forming a mask over said substrate;
   patterning said mask to expose sub-lithographic portions of said substrate;
   etching sections of said exposed sub-lithographic substrate portions to form said grooves using x-ray lithography.

10. The method of claim 1, prior to the grooved gate forming step, further comprising forming a gate oxide in said groove.

11. The method of claim 1, wherein the grooved gate forming step includes the steps of:
    forming a mask over said substrate;
    patterning said mask to expose portions of said substrate that include said groove;
    forming a gate stack in said expose substrate portions.

12. The method of claim 11, wherein the gate stack forming step includes the steps of:
    forming said grooved gate in said expose substrate portions;
    forming a gate conductor over said grooved gate; and
    forming a cover over top and sidewalls of said gate conductor and sidewalls of said grooved gate.

13. The method of claim 12, prior to the cover forming step, further comprising the steps of:
    removing the mask; and
    implanting impurities to form said first and second regions self-aligned to said grooved gate.

14. The method of claim 1, wherein the groove forming step includes the steps of:
    forming an insulating layer over said substrate;
    forming a mask over said insulating layer;
    patterning said mask to expose sub-lithographic portions of said substrate;
    removing said mask to expose said insulating layer;
    forming spacers over sidewalls of said insulating layer to reduce a width of said exposed sub-lithographic substrate portions; and etching said reduced sub-lithographic substrate portions to form said grooves.

15. The method of claim 1, wherein the groove forming step includes etching said substrate using phase-shift lithography.

16. The method of claim 1, wherein the groove forming step includes the steps of:

forming an oxide layer over said substrate;

forming a mask over said oxide layer;

patterning said mask to form an opening in said oxide layer for exposing portions of said substrate, said portions having a width equaling a feature size;

forming spacers over sidewalls of said oxide layer to reduce a width of said opening to a sub-lithographic size; and etching said parts of said substrate exposed through said sub-lithographic opening to form said groove which is approximately centered in said opening.

17. The method of claim 16, wherein the groove forming step further includes, after the mask patterning step, removing said mask.

18. The method of claim 16, the grooved gate forming step comprises the steps of:

removing said spacers after forming said groove to expose said groove and lateral portions of said substrate; and filling said opening with a gate stack including said gated groove formed in said groove and lower portions of said opening, a gate conductor formed over said grooved gate, and a cover formed over said gate conductor.

19. The method of claim 16, the filling step comprises the steps of:

filling said opening including said groove with intrinsic polysilicon;

recessing said intrinsic polysilicon into said opening;

doping said intrinsic polysilicon with impurities;

forming said gate conductor over said doped polysilicon in said opening;

recessing said gate conductor in said opening; and forming, said cover over said gate conductor in said opening.

20. The method of claim 1, wherein the grooved gate forming step defines said channel to have a width which is substantially equal to said length of said groove.

21. The method of claim 1, wherein the grooved gate forming step defines said channel to have a length-which includes a width of said gate bottom portion.

22. The method of claim 1, wherein the grooved gate forming step defines said channel to have a length which includes a width of said gate bottom portion and a depth of said groove.

23. The method of claim 1, wherein the grooved gate forming step defines said channel so that one of said channel sidewall sections located along one of said gate sidewall portions has a larger length than said bottom length of said bottom channel section.

24. The method of claim 1, wherein the first and second regions forming step forms said first and second regions along a length of said groove.

25. The method of claim 1, wherein the first and second regions forming step separates said first and second regions from said groove by top lateral sections of said channel, and the grooved gate forming step extends said grooved gate over said top lateral channel sections to said first and second regions.

26. The method of claim 1, wherein the grooved gate forming step extends said grooved gate over top lateral channel sections that separate said grooved gate from said first and second regions.

27. The method of claim 26, wherein the grooved gate forming step extends a length of said channel to include distances of said top lateral channel sections, said channel sidewall sections and said channel bottom section.

28. The method of claim 1, wherein the groove forming step forms a stepped groove and the grooved gate forming step forms a stepped grooved gate so that each of said gate sidewalls are separated by a lateral step into top and bottom sidewall parts.

29. The method of claim 28, wherein the grooved gate forming step forms said stepped grooved gate so that a distance between said top sidewall parts is larger than a distance between said bottom sidewall parts.

30. The method of claim 28, wherein the groove forming step that forms said stepped groove includes the steps of:

forming a dielectric layer over said substrate;

selectively etching said dielectric layer to form an opening therein having a first width that exposes portions of said substrate;

forming a resist over sidewalls of said opening to reduce said first width of said opening to a second width;

etching the exposed portions of said substrate to form a groove therein having a width that equals said second width;

removing the resist from the sidewalls of said opening; and etching said substrate to form said stepped groove having a lower width equaling said second width and an upper width equaling said first width.

31. The method of claim 28, wherein the groove forming step that forms said stepped groove includes the steps of:

forming a dielectric layer over said substrate;

selectively etching said dielectric layer to form a first opening, which exposes a first portion of said substrate;

forming a first pair of spacers on sidewalls of said first opening to form a second opening which is narrower than said first opening;

forming a second pair of spacers on said first pair of spacers to form a third opening which is narrower than said second opening;

etching said substrate through said third opening;

removing said second pair of spacers; and etching said substrate through said second opening.

32. The method of claim 1, wherein the groove forming step forms said groove in a centered position between said first and second regions.

33. The method of claim 1, wherein the first and second regions forming step forms said first and second regions which are self aligned to said grooved gate.

34. The method of claim 1, wherein the first and second regions forming step is performed prior to the groove forming step.

35. A method of manufacturing a memory cell comprising the steps of:

forming a deep trench capacitor in a substrate doped with a first type of impurity, said deep trench capacitor having a plate electrode formed in said substrate and a storage electrode;

forming first and second regions doped with a second type of impurity in said substrate, said first region being connected to said storage node of said deep trench capacitor;

forming a groove in said substrate between said first and second regions; and forming a grooved gate in said groove and beyond said groove extending a lateral distance over said substrate to control a resistance of a channel located in said substrate between said first and second regions; said groove gate extending a length of said channel to include sidewalls of said groove, a width of said groove, and said lateral distance.

* * * * *

UNITED STATES PATENT AND TRADEMARK OFFICE
CERTIFICATE OF CORRECTION

| | | |
|---|---|---|
| PATENT NO. | : 6,037,194 | Page 1 of 1 |
| APPLICATION NO. | : 09/281136 | |
| DATED | : March 14, 2000 | |
| INVENTOR(S) | : Gary B. Bronner et al. | |

It is certified that error appears in the above-identified patent and that said Letters Patent is hereby corrected as shown below:

On The Title Page, [73] Assignee: "Coirporation" should read --Corporation--

On The Title Page, [56] References Cited, U.S. PATENT DOCUMENTS:

Insert --5,675,164    10/1997        Brunner et al.--

Column 1, Line 27: "Cs" shoud read --$C_S$.--

Column 3, Line 7: "Node" should begin a new paragraph.

Column 4, Line 38: "suicide" should read --silicide--

Column 5, Line 18: "thereof Controlling" should read --thereof. Controlling--

Column 5, Line 41: "outdiffiising" should read --outdiffusing--

Column 9, Line 63: "N+layer" should read --$N^+$layer--

Column 10, Line 67: "word-lines" should read --wordlines--

Signed and Sealed this

Seventeenth Day of July, 2007

JON W. DUDAS
*Director of the United States Patent and Trademark Office*